(12) United States Patent
Seol et al.

(10) Patent No.: US 9,734,898 B2
(45) Date of Patent: Aug. 15, 2017

(54) MEMORY CONTROLLER HAVING STATE SHAPING ENGINE AND METHOD OF OPERATING SAME

(71) Applicant: SAMSUNG ELECTRONICS CO., LTD., Suwon-si, Gyeonggi-do (KR)

(72) Inventors: Changkyu Seol, Osan-si (KR); Junjin Kong, Yongin-si (KR); Hyejeong So, Seoul (KR); Hong Rak Son, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 181 days.

(21) Appl. No.: 14/308,739

(22) Filed: Jun. 19, 2014

(65) Prior Publication Data
US 2015/0058536 A1 Feb. 26, 2015

(30) Foreign Application Priority Data
Aug. 26, 2013 (KR) ........................ 10-2013-0101223

(51) Int. Cl.
*G06F 12/02* (2006.01)
*G11C 11/56* (2006.01)

(52) U.S. Cl.
CPC ...... *G11C 11/5621* (2013.01); *G06F 12/0246* (2013.01); *G06F 2212/72* (2013.01)

(58) Field of Classification Search
CPC ..... G06F 12/0246; G06F 2212/72–2212/7211; G06F 3/0679
See application file for complete search history.

(56) References Cited

U.S. PATENT DOCUMENTS

| 2007/0147168 A1* | 6/2007 | Pinto ................... G06F 12/0246 365/236 |
| 2012/0066436 A1 | 3/2012 | Yang |
| 2013/0024605 A1* | 1/2013 | Sharon ............... G06F 11/1072 711/103 |
| 2013/0024743 A1 | 1/2013 | Sharon et al. |
| 2013/0024746 A1 | 1/2013 | Sharon et al. |
| 2013/0024747 A1 | 1/2013 | Sharon et al. |
| 2013/0024748 A1 | 1/2013 | Sharon et al. |
| 2013/0191579 A1* | 7/2013 | Sharon ............... G11C 11/5628 711/103 |
| 2014/0157086 A1* | 6/2014 | Sharon ............... G06F 11/1012 714/773 |

FOREIGN PATENT DOCUMENTS

WO    2013/016168 A2    1/2013

OTHER PUBLICATIONS

Yen-Hao Shih, "3D Charge Trapping (CT) NAND Flash", C.Y. Lu (Macronix), Semicon Taiwan 2010.
(Continued)

*Primary Examiner* — Nicholas Simonetti
(74) *Attorney, Agent, or Firm* — Volentine & Whitt, PLLC

(57) ABSTRACT

A memory controller includes a state shaping encoder that receives k-bit write data, selects a logical page with reference to state shape mapping information, and changes data of the logical page to decrease an occurrence probability of a high-order program state among program states used to program the k-bit data in multi-level memory cells.

13 Claims, 22 Drawing Sheets

(56) References Cited

OTHER PUBLICATIONS

"Solid State Drive Applications in Storage and Embedded systems", Intel Technology Journal, vol. 13, Issue 1, 2009.
Ren-Shuo Liu et al., "Optimizing NAND Flash-Based SSDs via Retention Relaxation", Feb. 15, 2012 USENIX USENIX FAST '12.
Philipp Häfliger et al., "Computer architecture", Compendium for INF2270, Spring 2010.
Sungmin Park et al., "Polymorphic Mapping for Tera-scale Solid State Drivers" USENIX FAST '11.

* cited by examiner

Fig. 9

| Page | E | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| 1st Page | 1 | 1 | 1 | 1 | 0 | 0 | 1 | 1 | 0 | 0 | 1 | 1 | 0 | 0 | 0 | 0 |
| 2nd Page | 1 | 1 | 0 | 0 | 0 | 0 | 0 | 1 | 1 | 1 | 1 | 1 | 1 | 0 | 0 | 1 |
| 3rd Page | 1 | 0 | 0 | 0 | 0 | 1 | 1 | 1 | 1 | 0 | 0 | 0 | 0 | 0 | 1 | 1 |
| 4th Page | 1 | 1 | 1 | 0 | 0 | 0 | 0 | 0 | 0 | 0 | 0 | 1 | 1 | 1 | 1 | 1 |

Fig. 11

| Page | E | P1 | P2 | P3 | P4 | P5 | P6 | P7 | P8 | P9 | P10 | P11 | P12 | P13 | P14 | P15 | |
|---|---|---|---|---|---|---|---|---|---|---|---|---|---|---|---|---|---|
| 1st Page | 1 | 1 | 1 | 1 | 0 | 0 | 1 | 1 | 0 | 0 | 1 | 1 | 0 | 0 | 0 | 0 | |
| 2nd Page | 1 | 1 | 0 | 0 | 0 | 0 | 0 | 1 | 1 | 1 | 1 | 1 | 1 | 0 | 0 | 1 | |
| 3rd Page | 1 | 0 | 0 | 0 | 0 | 1 | 1 | 1 | 1 | 0 | 0 | 0 | 0 | 0 | 1 | 1 | |
| 4th Page | 1 | 1 | 1 | 0 | 0 | 0 | 0 | 0 | 0 | 0 | 0 | 1 | 1 | 1 | 1 | 1 | |
| Probability | 0.0517 | 0.0671 | 0.0671 | 0.0787 | 0.0671 | 0.0571 | 0.0671 | 0.0671 | 0.0571 | 0.0671 | 0.0787 | 0.0671 | 0.0571 | 0.0571 | 0.0487 | 0.0487 | |
| | → | ← | ← | ← | ← | → | ← | ← | → | ← | ← | ← | → | → | → | → | 1/16=0.0625 |

| Page | E | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| 1st Page | 1 | 1 | 1 | 1 | 0 | 0 | 1 | 1 | 0 | 0 | 1 | 1 | 0 | 0 | 0 | 0 |
| 2nd Page | 1 | 1 | 0 | 0 | 0 | 0 | 0 | 1 | 1 | 1 | 1 | 1 | 1 | 0 | 0 | 1 |
| 3rd Page | 1 | 0 | 0 | 0 | 0 | 1 | 1 | 1 | 1 | 0 | 0 | 0 | 0 | 0 | 1 | 1 |
| 4th Page | 1 | 1 | 1 | 0 | 0 | 0 | 0 | 0 | 0 | 0 | 0 | 1 | 1 | 1 | 1 | 1 |
| Probability | 0.0621 | 0.0621 | 0.0621 | 0.0729 | 0.0621 | 0.0621 | 0.0729 | 0.0729 | 0.0621 | 0.0621 | 0.0729 | 0.0621 | 0.0529 | 0.0529 | 0.0529 | 0.0529 |
|  | → | ← | ← | ← | ← | → | ← | ← | → | ← | ← | ← | → | → | → | → |

▨ 0.54   ▦ 0.46   ☐ 0.5

1/16 = 0.0625

US 9,734,898 B2

MEMORY CONTROLLER HAVING STATE SHAPING ENGINE AND METHOD OF OPERATING SAME

CROSS-REFERENCE TO RELATED APPLICATIONS

This U.S. non-provisional patent application claims priority under 35 U.S.C. §119 to Korean Patent Application No. 10-2013-0101223 filed on Aug. 26, 2013, the subject matter of which is hereby incorporated by reference.

BACKGROUND

The inventive concept relates generally to memory controllers capable of controlling the operation of a nonvolatile memory and method of operating such memory controllers.

Multi-level memory cells (MLC) configured in densely integrated memory cell array to store 2 or more data bits per MLC suffer from a number of operational effects and/or physical phenomena that tend to degrade the reliability of stored data over time. Many of these effects/phenomena are influenced, at least in part, by the pattern with which data is stored in a nonvolatile memory.

SUMMARY

Certain embodiments of the inventive concept provide a memory controller configured to control the operation of a nonvolatile memory device including multi-level memory cells (MLC) configured to store k-bit data per MLC according to k logical pages where "k" is a natural number greater than 1. The memory controller includes a state shaping encoder that receives k-bit incoming write data from a host, selects at least one logical page of the k-bit incoming write data with reference to state shape mapping information, and changes data of the selected at least one logical page to decrease an occurrence probability of at least one high-order program state among a plurality of program states associated with the programming of the k-bit data in the MLC, whereby the changing of the data of the selected at least one logical page generates corresponding state-shaped encoded write data programmed to the nonvolatile memory device.

BRIEF DESCRIPTION OF THE DRAWINGS

FIG. 9 is a conceptual diagram illustrating program states and an erase state for a 4-bit MLC nonvolatile memory device.

FIG. 11 is a conceptual diagram illustrating in another example the execution of a state shaping encoding operation during operation of a 4-bit MLC nonvolatile memory device in accordance with certain embodiments of the inventive concept.

FIG. 12 is a conceptual diagram illustrating in still another example the execution of a state shaping encoding operation during operation of a 4-bit MLC nonvolatile memory device in accordance with certain embodiments of the inventive concept.

DETAILED DESCRIPTION

Embodiments of inventive concepts will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the inventive concept to those skilled in the art. Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or"

includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
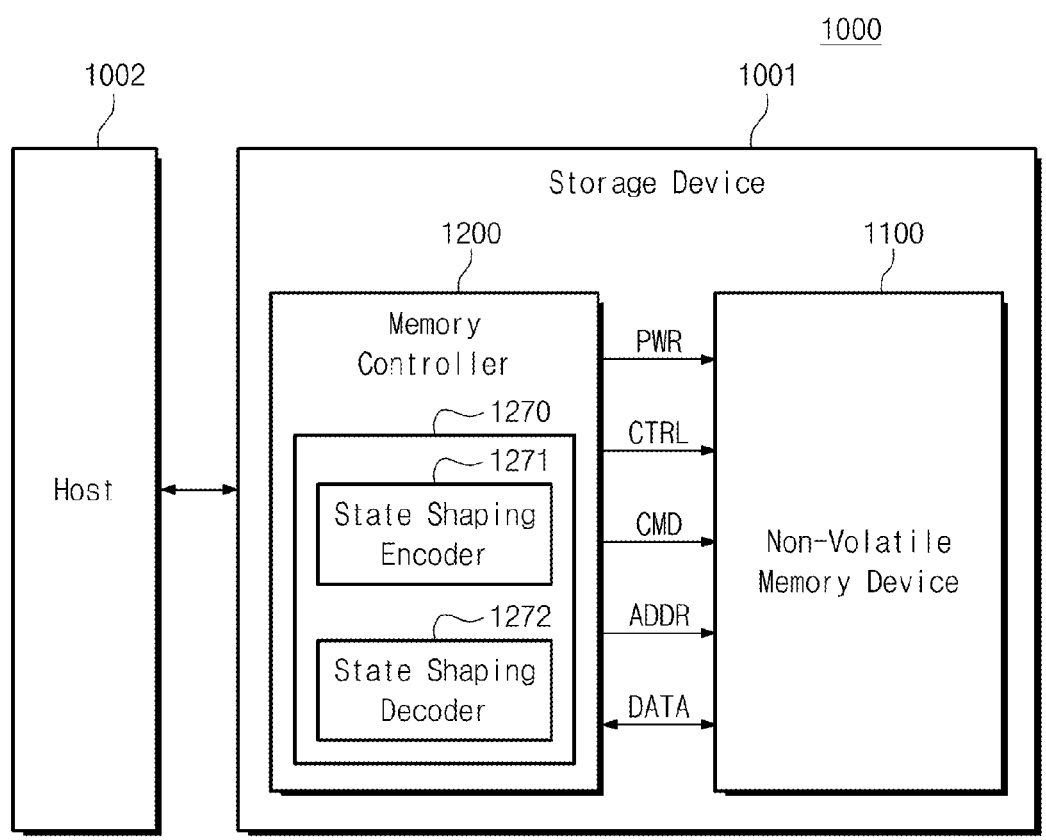
FIG. 1 is a block diagram illustrating a memory system in accordance with certain embodiments of the inventive concept.

FIG. 1 is a block diagram illustrating a memory system 1000 in accordance with certain embodiments of the inventive concept.

The memory system 1000 may be embodied within a particular electronic device, such as a mobile phone, smart phone, tablet, personal computer (PC), personal digital assistant (PDA), enterprise digital assistant (EDA), digital still camera, digital video camera, portable multimedia player (PMP), personal navigation device or portable navigation device (PDN), hand-held game console, e-book, etc.

As generally shown in FIG. 1, the memory system 1000 comprises a storage device 1001 operatively connected to a host 1002, wherein the host 1002 may be assumed to communicate "write data" to the storage device 1001 during a write (or program) operation and receive "read data" retrieved from the storage device during a read operation.

The storage device 1001 includes a nonvolatile memory device 1100 and a memory controller 1200, wherein the memory controller 1200 may be assumed to generally control the operation of the nonvolatile memory device 1100 including at least the execution of write, read, and/or erase operations. In general operation, the nonvolatile memory device 1100 receives a command (CMD) along with a corresponding address (ADDR) and/or data (DATA) via a collection of variously arranged input/output (I/O) lines. The nonvolatile memory device 1100 also receives power (PWR) via one or more power line(s) as well as one or more control signals (CTRL) via one or more control line(s). The control signal CTRL may include, for example, one or more conventionally understood control signals, such as a command latch enable (CLE), address latch enable (ALE), chip enable (nCE), write enable (nWE), read enable (nRE), etc.

The nonvolatile memory device 1100 may include one or more of a flash memory, electrically erasable programmable read only memory (EEPROM), ferroelectric random access memory (FRAM), phase change RAM (PRAM), magneto resistive RAM (MRAM), etc. Certain NAND flash memory devices are variously illustrated in the drawings that correspond to the following written description, but those skilled in the art will understand that these are merely examples of different memory types that may be alternately and/or additionally incorporated within other embodiments of the inventive concept.

Further, the nonvolatile memory device 1100 shown in FIG. 1 may include one or more memory cell arrays, including possibly three-dimensional memory cell array(s), that store data using constituent single-level memory cell(s) (SLC) capable of storing a single bit per memory cell, and/or multi-level memory cell(s) (MLC) capable of storing 2 or more bits per memory cell.

Increased memory cell density in contemporary nonvolatile memory devices poises many design and fabrication challenges. For example, as the space between adjacent memory cells decreases, certain reliability degradations that may be influenced by the pattern with which data is programmed in the memory cell array (hereafter, "data pattern") increasingly occur. While there are various causes of reliability degradations, so-called F-poly coupling (an effect that causes widening of threshold voltage distributions) and back pattern dependency are phenomena that have been observed as being influenced by particular data patterns. Hence, the adverse effects on data reliability caused by F-poly coupling and back pattern dependency may be mitigated to a degree by controlling the data pattern with which write data is programmed in a memory cell array. For example, degradation in data reliability due to F-poly coupling may be mitigated by reducing the number of incidences in a data pattern wherein a memory cell having an erased state is adjacent to a memory cell programmed to a most significant program state.

Certain embodiments of the inventive concept further recognize that data reliability degradations within a nonvolatile memory device such as those related to F-poly coupling and/or back pattern dependency may be reduced by state shaping of the write data originally received by the storage device 1001 from host 1002 (hereafter referred to as "incoming write data"). The concept of "state shaping" and various modes of accomplishing same will be described in detail hereafter.

As shown in FIG. 1, the memory controller 1200 operating within the storage device 1001 may include a state shaping engine 1270 capable of performing state shaping of incoming write data, as well as an analogously required state (re-)shaping of outgoing read data. Thus, the state shaping engine 1270 may be functionally understood as including a state shaping encoder 1271 and a state shaping decoder 1272.

The state shaping encoder 1271 may be used to "encode" incoming write data to avoid presentation to the nonvolatile memory device 1100 of certain data patterns that are understood to degrade reliability of the data stored in the nonvolatile memory device 1100. Thus, "state-shaped encoded write data" will be provided to the nonvolatile memory device 1100 for storage in place of the incoming write data.

Thereafter, the state shaping decoder 1272 may be used to "decode" the state-shaped encoded write data stored by, and retrieved from the nonvolatile memory device 1100 (now designated "state-shaped encoded read data") in order to provide a decoded version of the stored data that is ultimately returned, as read data accurately corresponding to the incoming write data, to the memory controller 1200. The state-shaped decoding process may be understood as rechanging the changed data of a selected logical page back to its original (pre-state-shaped) configuration.

Figure 2:
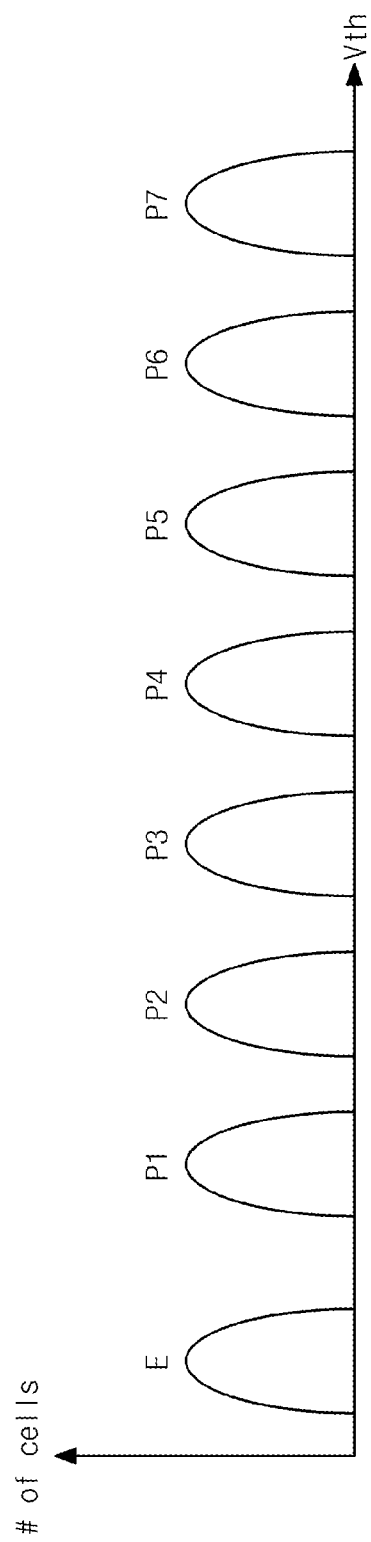
FIG. 2 is a drawing illustrating a threshold voltage distribution associated with a 3-bit multi-level cell (MLC).

FIG. 2 is a conceptual diagram illustrating a threshold voltage distribution for a 3-bit MLC, including an erase state and seven (7) possible program states P1-P7, wherein program state P7 is denominated "the highest program state"; program state P1 is denominated the "lowest program state" and program states P2-P6 are intermediate program states of sequentially increasing threshold voltage level (Vth).

Of course, MLC may be configured to store more than 2 or 3 bits per memory cells. Assuming that "k" bits per memory cell may be stored by a flash MLC, any one of $2^k$ threshold voltage distributions may be used to distinctly indicate a data value stored by the flash MLC. Each particular data value would ideally be programmable to every MLC being used to store the data value with exactly the same threshold voltage level. However, this is not practically possible and it is well understood that respective data values are indicated by a threshold voltage falling within a prescribed threshold voltage range or distribution that is logically associated with the data value.

Referring to FIGS. 1 and 2, the state shaping encoder 1271 provided within the memory controller 1200 may be sued to encode the incoming write data to reduce the number of MLC programmed to the highest program state (P7). This reduction in the number of MLC programmed to the P7 program state tends to diminish certain effects (e.g., F-poly coupling) resulting in degraded data reliability.

Figure 3:
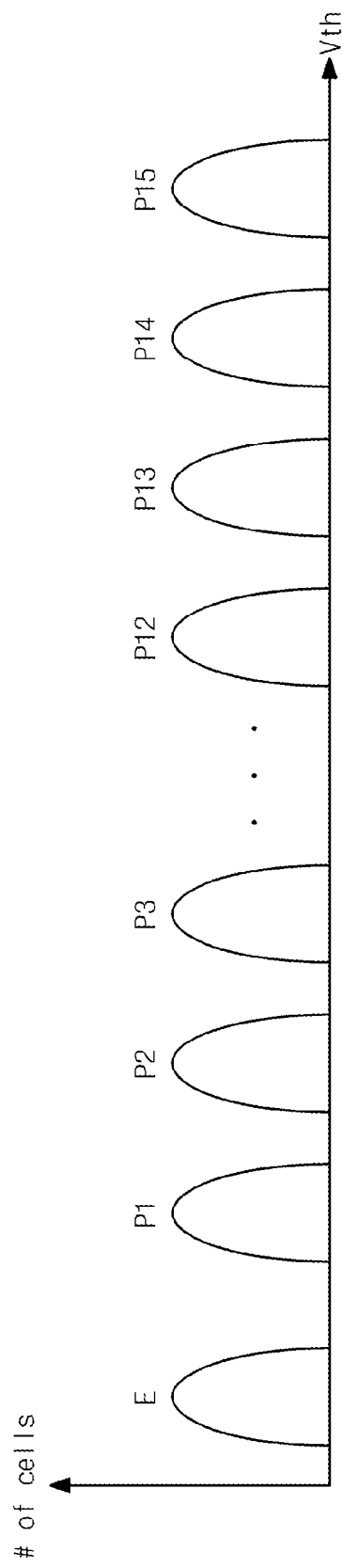
FIG. 3 is a drawing illustrating a threshold voltage distribution associated with a 4-bit MLC.

FIG. 3 is a conceptual diagram illustrating a threshold voltage distribution for 4-bit MLC, including an erase state and fifteen (15) possible program states P1-P15, wherein program state P15 is denominated "the highest program state"; program state P1 is denominated the "lowest program state" and program states P2-P14 are intermediate program states of sequentially increasing threshold voltage level (Vth). Here again, within certain embodiments of the inventive concept, the state shaping encoder 1271 may be used to encode the incoming write data to reduce the number of MLC programmed to the highest program state (P15). This reduction in the number of MLC programmed to the P15 program state similarly tends to diminish certain effects (e.g., F-poly coupling) resulting in degraded data reliability.

Figure 4:
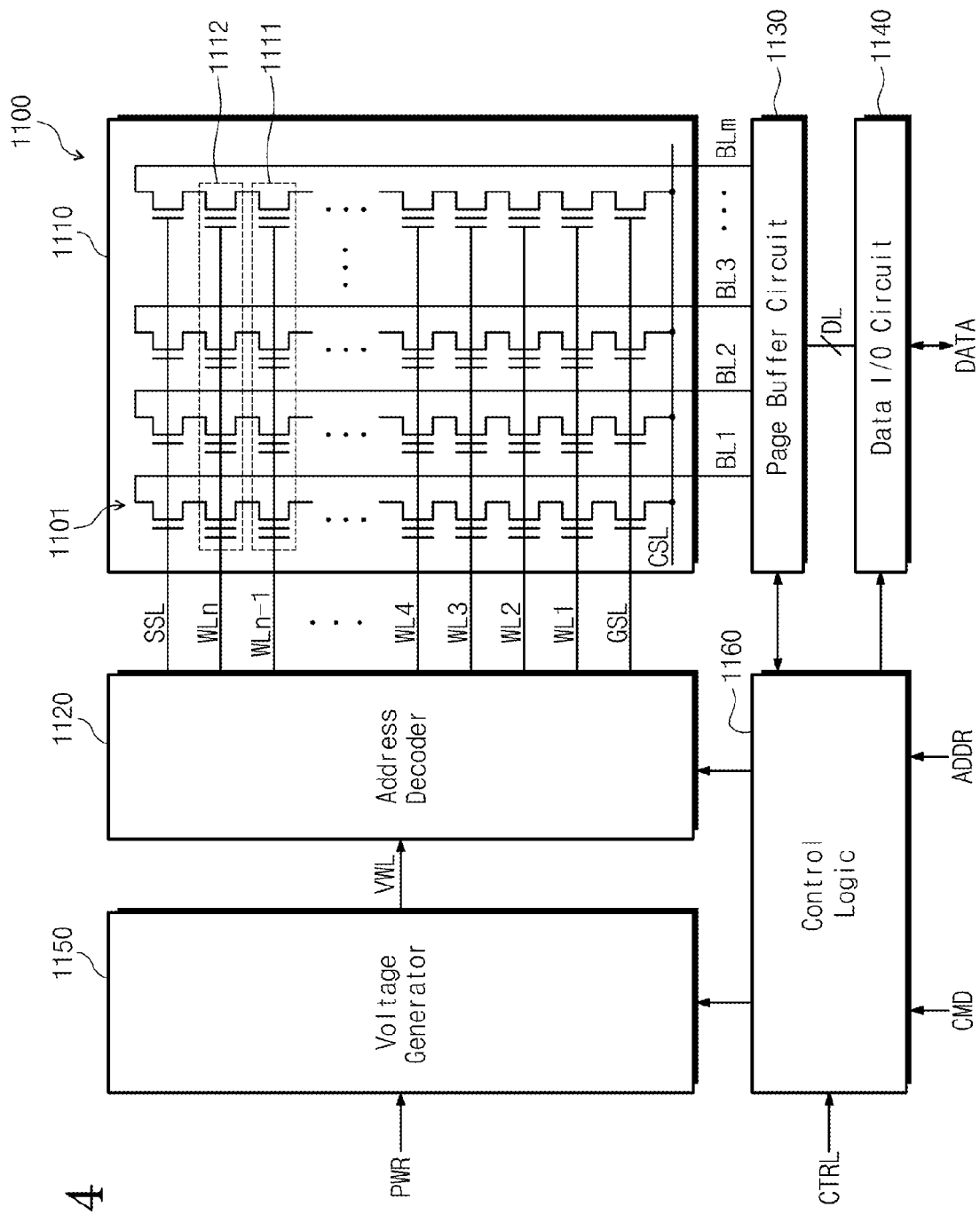
FIG. 4 is a block diagram further illustrating in one example the nonvolatile memory device 1100 of FIG. 1.

FIG. 4 is a block diagram further illustrating in one example the nonvolatile memory device 1100 of FIG. 1. Referring to FIGS. 4, the nonvolatile memory device 1100 generally includes in relevant portions a memory cell array 1110, an address decoder 1120, a page buffer circuit 1130, a data input/output (I/O) circuit 1140, a voltage generator 150 and control logic 1160.

The cell array 1110 is connected to the address decoder 1120 through word lines WL1~WLn or select lines (SSL, GSL). The cell array 1110 is connected to the page buffer circuit 1130 through bit lines BL1~BLm. The cell array 1110 includes a plurality of NAND type cell strings.

Each of the cell strings can form a channel in a vertical direction or a horizontal direction. A plurality of word lines can be stacked in a vertical direction in the cell array 1110. The cell array 1110 includes multiple blocks, each being an erase unit. Each block includes a plurality of pages, each being a program unit and a read unit.

The address decoder 1120 can select any one among memory blocks of the cell array 1110 according to an address (ADDR). The address decoder 1120 can select any one among word lines of the selected memory block. The address decoder 1120 transmits a voltage generated from the voltage generator 1150 to the word line of the selected memory block.

The cell array 1110 is assumed to include "n" word lines, wherein each word line is associated with a plurality of logical pages. For example, assuming the use of 3-bit MLC, each word line may respectively be used to program up to three (3) logical pages of data to the 3-bit MLC operationally connect to same. That is, each memory cell may be programmed to one state selected from among the seven program states (P1~P7) and the erase state (E), and assuming the use of 4-bit MLC, each word line may respectively be used to program up to four (4) logical pages of data to the 4-bit MLC operationally connect to same. That is, each memory cell may be programmed to one state selected from among the fifteen program states (P1~P15) and the erase state (E).

The page buffer circuit 1130 functions as a write driver circuit during program operations and as a sensing amplifier during read operations. When a program operation is performed, the page buffer circuit 1130 communicates a bit line voltage corresponding to a particular data value to be programmed to a bit line of the memory cell array 1110. Here, the page buffer circuit 1130 may be used to store "data pattern information" in designated MLC, such as those operationally associated with a selected word line. When a read operation is performed, the page buffer circuit 1130 may be used to sense data stored in relation to a selected word line through a bit line. Here, the page buffer circuit 1130 may be used to latch the sensed data before communicating same to the data I/O circuit 1140.

When a program operation is performed, the data I/O circuit 1140 communicates write data being received to the page buffer circuit 1130. When a read operation is performed, the data I/O circuit 1140 outputs read data that has been retrieved by the page buffer circuit 1130 to an external device.

The control logic 1160 controls the page buffer circuit 1130 and the voltage generator 1150 according to a command (CMD) and an address (ADDR). The voltage generator 1150 generates various kinds of word line voltages to be provided to word lines and a voltage to be provided to a bulk (for example, a well region) in which memory cells are formed. Examples of the word line voltages to be provided to word lines include a program voltage (Vpgm), a pass voltage (Vpass) and select & unselect read voltages (Vrd and Vread). When read and program operations are performed, the voltage generator 1150 can generate select line voltages (VSSL and VGSL) being provided to the select lines SSL and GSL.

Figure 5:
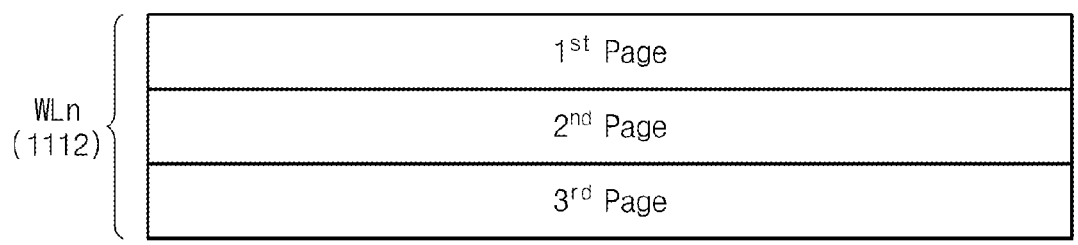
FIG. 5 is a conceptual diagram illustrating a logical page arrangement for a 3-bit MLC flash memory device.

FIG. 5 is a conceptual diagram illustrating one arrangement of logical pages that may be used to store data in a 3-bit MLC. Referring to FIGS. 2 and 5, the 3 bit MLC flash memory device may be operated using seven program states and one erase state to program MLC connected to a selected word line and capable of storing data associated with each one of three (3) logical pages. Thus, data may be stored in three (3) logical pages according to threshold voltages respectively associated with one of the seven program states and one erase state. Referring to FIGS. 4 and 5, the nth word line WLn 1112 is assumed to be associated with up to three (3) logical pages.

Figure 6:
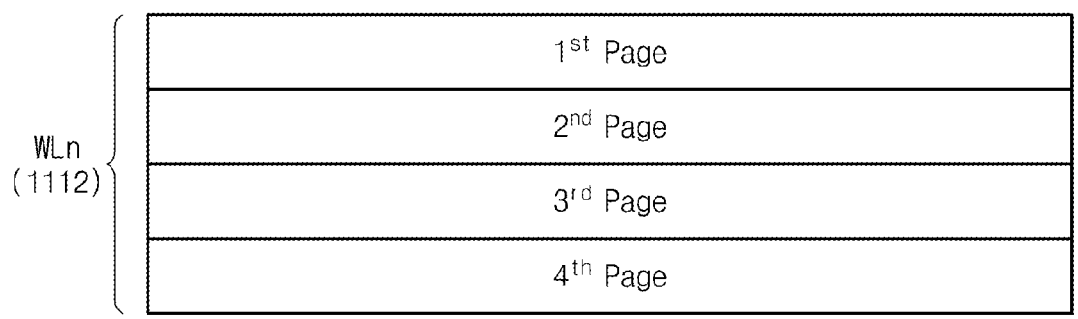
FIG. 6 is a conceptual diagram illustrating a logical page arrangement for a 4-bit MLC flash memory device.

FIG. 6 is a conceptual diagram illustrating one arrangement of logical pages that may be used to store data in a 4-bit MLC. Referring to FIGS. 3 and 6, the 4 bit MLC flash memory device may be operated using fifteen program states and one erase state to program MLC connected to a selected word line and capable of storing data associated with each one of four (4) logical pages. Thus, data stored in the four (4) logical pages according to threshold voltages respectively associated with one of fifteen program states and one erase state. Referring to FIGS. 4 and 6, again the nth word line WLn 1112 is assumed to be associated with up to four (4) logical pages.

Figure 7:
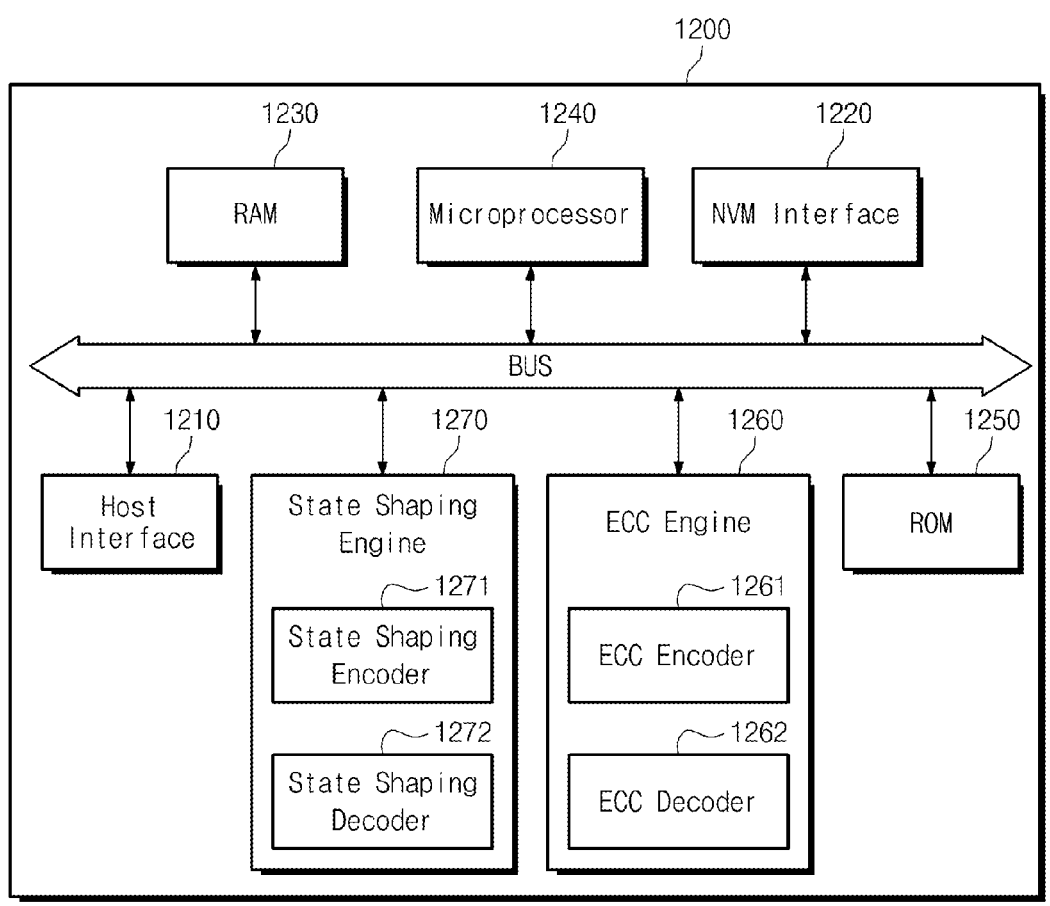
FIG. 7 is a block diagram further illustrating in one example the memory controller 1200 of FIG. 1.

FIG. 7 is a block diagram further illustrating the memory controller 1200 of FIG. 1. Referring to FIG. 7, the memory controller 1200 generally includes in relevant portions a host interface 1210, a nonvolatile memory interface 1220, a random access memory (RAM) 1230, a microprocessor 1240, a read only memory (ROM) 1250, an error detection and/or correction (ECC) engine 1260, and the state shaping engine 1270. The constituent elements 1210, 1220, 1230, 1240, 1250, 1260 and 1270 of the memory controller 1200, for example, may be operationally interconnected using one or more arrangement(s) of signal lines and/or bus(es) (collectively or singularly indicated as "BUS").

The host interface 1210 may be used to create an interface between the storage device 1001 and host 1002 according to a predetermined protocol. The host interface 1210 can communicate with an external host through a USB (universal serial bus), a SCSI (small computer small interface), a PCI (peripheral component interconnection), an ATA (advanced technology attachment), a PATA (parallel-ATA), a SATA (serial-ATA), a SAS (serial attached SCSI), etc.

The nonvolatile memory interface 1220 may be used to create an interface between the memory controller 1200 and the nonvolatile memory device 1100. Various command(s) required by the microprocessor 1240 may be provided to the nonvolatile memory device 1100 through the nonvolatile memory interface 1220. Data may be communicated from the memory controller 1200 to the nonvolatile memory device 1100 according to a protocol established by the nonvolatile memory interface. Data being provided from the nonvolatile memory device 1100 is assumed to be provided via the memory controller 1200 through the nonvolatile memory interface 1220.

The RAM 1230 is a volatile memory that functions as a buffer memory. The RAM 1230 may be used to store commands, control information, and data of all sorts received from the host interface 1210, as well as all sorts of data, parameters and variables provided from the nonvolatile memory device 1100. In certain embodiments of the inventive concept, the RAM 1230 may be used to store and provide "state shape mapping information". As will be described hereafter, the state shape mapping information may be used to coherently change certain data values for write data to be programmed to the nonvolatile memory device 1100, as well as for read data retrieved from the nonvolatile memory device 1100.

Here, the state shape mapping information may serve as a reference to change (e.g., essentially selecting between a "0" or a "1" bit value) for data associated with a particular data state or a corresponding portion of the incoming write data. Thus, the state shaping engine 1270 may be used to change incoming write data provided from the host 1002 in order to alter a data pattern associated with the incoming write data. In one particular approach, some or all of the highest program state values for data in the incoming write data may be changed with reference to state shape mapping information provided by the RAM 1230.

The microprocessor 1240 can be embodied by a circuit, logic, code or combinations thereof. The microprocessor 1240 controls an overall operation of the storage device 1001 including the memory controller 1200. If power is applied to the storage device 1001, the microprocessor 1240 can control an overall operation of the memory system 1000 by driving firmware for an operation of the memory system 1000 stored in the ROM 1250 on the RAM 1230. The microprocessor 1240 can interpret a command being applied from the host to control an overall operation of the nonvolatile memory device 1100 according to an interpretation result.

The ROM 1250 may be used to store a firmware code controlling the operation of the storage device 1001, as well as the code necessary to the operation of the memory controller 1200. However, the inventive concept is not limited thereto. The firmware code may be stored in various types of nonvolatile memory devices 1100, for example, a flash memory device, besides the ROM 1250.

Control or intervention of the microprocessor 1240 can include not only direct hardware control of the microprocessor 1240 but also intervention of a firmware which is a software being driven by the microprocessor 1240.

The ROM 1250 may be used to store state shape mapping information. In certain embodiments of the inventive concept, the state shape mapping information may be used as mapping information that effectively swaps at least one relatively high-order program state for at least one relative and corresponding low-order program state. In this regard, certain state shape mapping information may be predetermined and stored in the memory controller 1200 during its manufacture.

The ECC engine 1260 may be used to perform one or more bit error detection and correction operations. Referring to FIG. 7, the ECC engine 1260 generally includes an ECC encoder 1261 and an ECC decoder 1262. Here, the ECC encoder 1261 is assumed to perform an error correction encoding of the incoming write data to be programmed to the nonvolatile memory device 1100 to thereby generate corresponding parity data. The parity data may then be stored in the nonvolatile memory device 1100 along with the write data. Analogously, the ECC decoder 1262 may be used to perform an error correction decoding on read data retrieved from the nonvolatile memory device 1100. Such an operation may determine whether or not error correction decoding is successful according to a performance result and outputs a signal indicating the determination results. Hence, data errors in read data passed through the ECC decoder 1262 may be corrected using the parity data generated by the ECC encoder 1261 so long as the number of bit errors does not exceed the limit of correctable bit errors.

The ECC encoder 1261 and the ECC decoder 1262 can perform an error correction using a coded modulation such as a low density parity check (LDPC) code, a BCH code, a turbo code, a Reed-Solomon code, a convolution code, a recursive systematic code (RSC), a trellis-coded modulation (TCM), a block coded modulation (BCM), etc. However, the inventive concept is not limited thereto.

The ECC encoder 1261 and the ECC decoder 1262 can include a circuit, a system or a device for an error correction. In case of performing a state shaping of ECC encoded data, the ECC encoded data may become original data being provided to the state shaping engine 1270. A state shaping is performed on original data provided from the host and the state shaping encoded data may be provided to the ECC encoder 1261.

The state shaping engine 1270 shown in FIG. 7 includes a state shaping encoder 1271 and a state shaping decoder 1272. The state shaping encoder 1271 may be used to effectively encode incoming write data to mitigate certain effects known to degrade the reliability of data stored in the nonvolatile memory device 1100. The resulting "state-shaped encoded write data" (e.g., a version of the incoming write data having at least one changed program state) may then be provided to the nonvolatile memory device 1100 for programming. However, in certain embodiments of the inventive concept, the state-shaped encoded write data provided by the state shaping engine 1270 may first pass through the ECC encoder 1261 to be conventionally ECC encoded before programming to the nonvolatile memory device 1100.

In an analogous manner, the state shaping decoder 1272 may be used to decodes "state-shaped encoded read data" retrieved from the nonvolatile memory device 1100 during a read operation. By operation of the state shaping decoder 1272 the state-shaped encoded read data may be converted to outgoing read data accurately corresponding to the incoming write data. Here again, the retrieved state-shaped encoded read data may first pass through the ECC decoder 1262 and be conventionally ECC decoded before reaching the state shaping decoder 1272.

Thus, the state shaping encoder 1271 may be used to perform a state shape encoding operation with reference to state shape mapping information provided by the ROM 1250 and/or by the nonvolatile memory device 1100. The state shape mapping information may be predetermined and set during the manufacture of the controller 1200, and/or may be programmed to the controller 1200 during periodic software updates.

From the foregoing description, those skilled in the art will understand that the state shape mapping information controlling state shape encoding/decoding operations may be variously determined. For example, in one fairly straightforward example, state shape mapping information may take the form of (re-)mapping information that essentially swaps the respective definitions (and hence, the subsequent programming occurrence) of a relatively high-order program state (e.g., P7 or P15 from FIGS. 2 and 3) with that of a relatively low-order program state (e.g., P1 of FIGS. 2 and 3). In this manner, the ratio of overall occurrence of the high-order program state in the incoming write data may be markedly reduced, whereas the ration of overall occurrence of the low-order program state may be increased. In certain examples, the state shape mapping information may include information that may be used to change (or swap) program states occurring in a set of incoming write data. In other examples, the state shape mapping information may include information that may be used to rearrange logical pages of the incoming write data.

Referring to FIGS. 5 through 7, certain state shape mapping information may be related to the nature of the various logical pages of data to be programmed to a collection of MLC. That is, in view of the states to be programmed to multiple adjacent MLC, one or more logical pages may be re-ordered in their programming arrangement (e.g., $2^{nd}$ page, $1^{st}$ page, $3^{rd}$ page for FIG. 5) as compared with the ordered arrangement of logical pages in the incoming write data. Thus, by re-ordering logical pages during the state shape encoding process, the program states ultimately programmed to the MLC of the nonvolatile memory device 1100 may be effectively changed to avoid less desirable data patterns. In this manner, the state shaping encoder 1271 may select one or more logical pages to be re-ordered during a state shaping encoding operation according to corresponding state shape mapping information.

Figure 8:
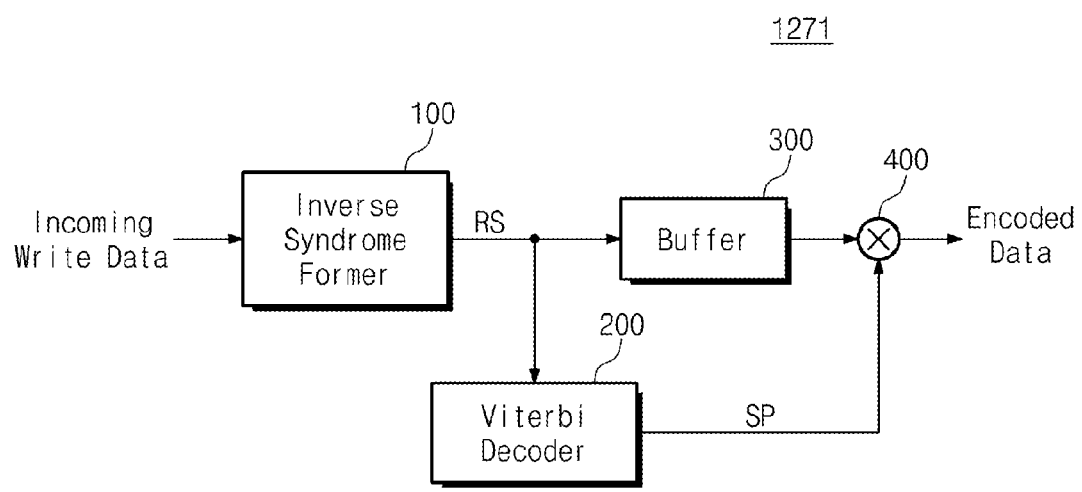
FIG. 8 is a block diagram further illustrating in one example the state shaping encoder 1271 of FIG. 7.

FIG. 8 is a block diagram further illustrating a state shaping encoder 1271 of FIG. 7. Referring to FIG. 8, the state shaping encoder 1271 includes an inverse syndrome former 100, a viterbi decoder 200, a buffer 300 and an exclusive OR (XOR) operator 400.

The inverse syndrome former 100 receives the incoming write data and generates an coset representative sequence (RS) that can be divided into "m" bit units, wherein m is a natural number greater than 1. The length of the coset representative sequence (RS) is "N", wherein N is a natural number. Thus, N can be divided by m bits.

The viterbi decoder 200 performs a 1 XOR operation on each of m bits of the coset representative sequence RS to generate convolution encoded binary bits, and thereby determines a survivor path sequence (SP) according to the 1 XOR operation. Thus, the viterbi decoder 200 performs the 1 XOR sequence in m unit blocks, determines the survivor path sequence (SP) with reference to state shape mapping information, and then provides the determined survivor path sequence to the XOR operator 400.

The buffer 300 temporarily stores the coset representative sequence (RS), and functions as a delay buffer compatible with the timing of operation for the viterbi decoder 200.

The XOR operator 400 performs a 2 XOR operation between the coset representative sequence (RS) and the survivor path sequence (SP) to form the state-shaped encoded write data.

FIG. 9 is a conceptual diagram illustrating program states and an erase state for a 4-bit MLC nonvolatile memory device as well as an example of state ordering of the 4-bit MLC nonvolatile memory device 1100.

Referring to FIG. 9, the 4-bit MLC nonvolatile memory device 1100 includes four (4) logical pages and has a data pattern defined by the fifteen (15) program states and the erase state. Referring to FIGS. 3 and 9, a particular program state may be designated as the "high-order program state" (e.g., one of P12, P13, P14 and P15). These program states are indicated by corresponding threshold voltage distributions that are highly separated from the threshold voltage distribution indicating the erase state E. In contrast, a particular program state may be designated as the "low-order program state" (e.g., one of P1, P2, P3 and P4). These program states are indicated by corresponding threshold voltage distributions that are relatively not highly separated (or "proximate") from the threshold voltage distribution indicating the erase state E.

In this context and referring to FIG. 9, the distribution probability for each one of the erase state and various program states P1 through P15 is equal at 1/16 or 0.0625. However, as previously noted, data programmed in an orderly manner according to these equally probable states may very well result in adverse data patterns for the stored data.

Figure 10:
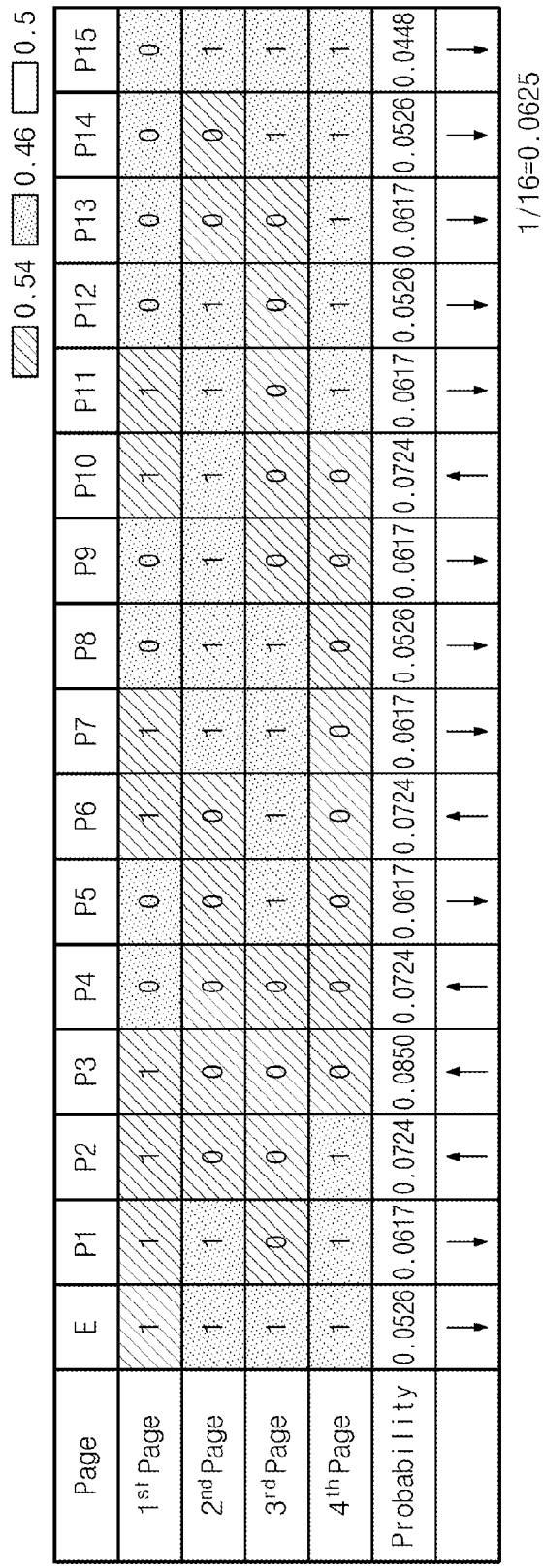
FIG. 10 is a conceptual diagram illustrating in one example the execution of a state shaping encoding operation during operation of a 4-bit MLC nonvolatile memory device in accordance with certain embodiments of the inventive concept.

FIG. 10 is a conceptual diagram illustrating execution of a state shaping encoding operation by a 4-bit MLC nonvolatile memory device 1100. Referring to FIG. 10, the 4-bit MLC nonvolatile memory device 1100 is assumed to include four (4) logical pages including MLC programmed to one of an erase state E and fifteen (15) program states (P1 through P15). In case of FIG. 10, according to corresponding state shape mapping information, a state shaping operation may be executed on the data of the four (4) logical pages.

Comparing FIGS. 9 and 10, when performing a state shaping operation to reduce the ratio of "1" values in a logical page, a ratio of "1's" to "0's" is 0.46 (point representation) to 0.54 (oblique line representation). When performing a state shaping operation to reduce the ratio of "0" values in a logical page, a ratio "1's" to "0's" is 0.54 to 0.46. If not applying a state shaping operation, the ratio of "1's" to "0's" in a logical page becomes 0.5 to 0.5.

In FIG. 10, the direction-arrow for each state indicates an increase or a decrease of occurrence probability after performing a state shaping operation, as compared with not performing a state shaping operation. For example, in the first logical page, it is assumed that a state shaping operation that reduces the number of "0's" is performed. Thus, a ratio "1's" to "0's" is 0.54 to 0.46 in the first logical page. However, in the second, third and fourth logical pages, a state shaping operation that reduces the number of "1's" is performed. Accordingly, a ratio of "1's" to "0's" is 0.46 to 0.54 in the second, third and fourth logical pages.

As a result, the occurrence probability associated with the highest program state P15 may be reduced from 0.0625 to 0.0448. Therefore, a state shaping encoder consistent with embodiments of the inventive concept may be used to reduce the occurrence probability of a highest (or relatively high) program state for write data to be programmed. Since the occurrence probability for the highest program state is reduced, the commensurately adverse effects of data patterns having a higher occurrence probability for the highest program state may be mitigated, thereby characteristic degradation of data stored in MLC may be reduced.

Referring to FIG. 10, by use of a state shaping operation, not only the occurrence probability of the highest program state (P15) is reduced, but also the occurrence probability of relatively high program states (P11, P12, P13 and P14) are reduced. That is, the occurrence probability of program state P14 is reduced from 0.0625 to 0.0526, the occurrence probability of program state P13 is reduced from 0.0625 to 0.0617, the occurrence probability of program state P12 is reduced from 0.0625 to 0.0526, and the occurrence probability of program state P11 is reduced from 0.0625 to 0.0617. In contrast, the respective occurrence probabilities associated with program states P2, P3, P4, P6 and P10 increases as compared with the occurrence probability before the state shaping operation is performed. In this manner, data corresponding to certain high-order program states may be reduced along with phenomena such as coupling and back pattern dependency that degrade reliability of the nonvolatile memory device.

FIG. 11 is a conceptual diagram illustrating another state shaping encoding operation for a 4-bit MLC nonvolatile memory device according to other embodiments of the inventive concept. In FIG. 11, according to state shape mapping information, a state shaping operation is performed on data that is stored according to three (3) logical pages (first, third and fourth logical pages).

Comparing FIGS. 9 and 11, upon performing a state shaping operation to reduce a ratio of "1's" in a logical page, the ratio of "1's" to "0's" is 0.46 to 0.54. Upon performing a state shaping operation to reduce a ratio of "0's" in a logical page, the ratio of "1's" to "0's" is 0.54 to 0.46. As before, upon not applying a state shaping operation in a logical page, the ratio of "1's" to "0's" becomes 0.5 to 0.5.

As before, the direction-arrows shown in FIG. 11 indicate an increase or decrease of occurrence probability for each state after performing a state shaping operation, as compared with not performing a state shaping operation.

For example, in the first logical page, a state shaping operation reducing the number of "0's" is performed. Thus, a ratio of "1's" to "0's" is 0.54 to 0.46 in the first logical page. In the third and fourth logical pages, a state shaping operation reducing the number "1's" is performed. Thus, a ratio of the number of "1's" to "0's" is 0.46 to 0.54 in the third and fourth logical pages. As a result, the occurrence probability of the highest program state P15 is reduced from 0.0625 to 0.0487, the occurrence probability of the program state P14 is reduced from 0.0625 to 0.0487, the occurrence probability of the program state P13 is reduced from 0.0625 to 0.0571, and the occurrence probability of the program state P12 is reduced from 0.0625 to 0.0571. The respective occurrence probabilities of P1, P2, P3, P4, P6 and P7 are increased as compared with the not performing a state shaping operation.

FIG. 12 is a conceptual diagram illustrating still another state shaping operation according to certain embodiments of the inventive concept for a 4-bit MLC nonvolatile memory device. In FIG. 12, according to state shaping mapping information, a state shaping operation is performed on data corresponding to the first through fourth logical pages.

Comparing FIGS. 9 and 12, upon performing a state shaping operation to reduce a ratio of "1's" in a logical page, the ratio of "1's" to "0's" is 0.46 to 0.54. Upon performing a state shaping operation to reduce a ratio of "0's" in a logical page, the ratio of "1's" to "0's" is 0.54 to 0.46. Upon not applying a state shaping operation in a logical page, the ratio of "1's" and "0's" is again 0.5 to 0.5.

Consistent with the above description assuming that the first logical page is subjected to a state shaping operation that reduces the number of "0's", a ratio of "1's" to "0's" is 0.54 to 0.46. Assuming that the fourth logical page is subjected to a state shaping operation that reduces the number of data "1's, a ratio of "1's" to "0's" is 0.46 to 0.54 in the fourth logical page.

As a result, the occurrence probability for the highest program state P15 is reduced from 0.0625 to 0.0529, the occurrence probability for the program states P12, P13 and P14 are respectively reduced from 0.0625 to 0.0529, and the occurrence probability for the program state P11 is reduced from 0.0625 to 0.0621. Occurrence probabilities for the program states P3, P6 and P7 increase as compared with the occurrence probabilities derived by not performing a state shaping operation.

Figure 13:
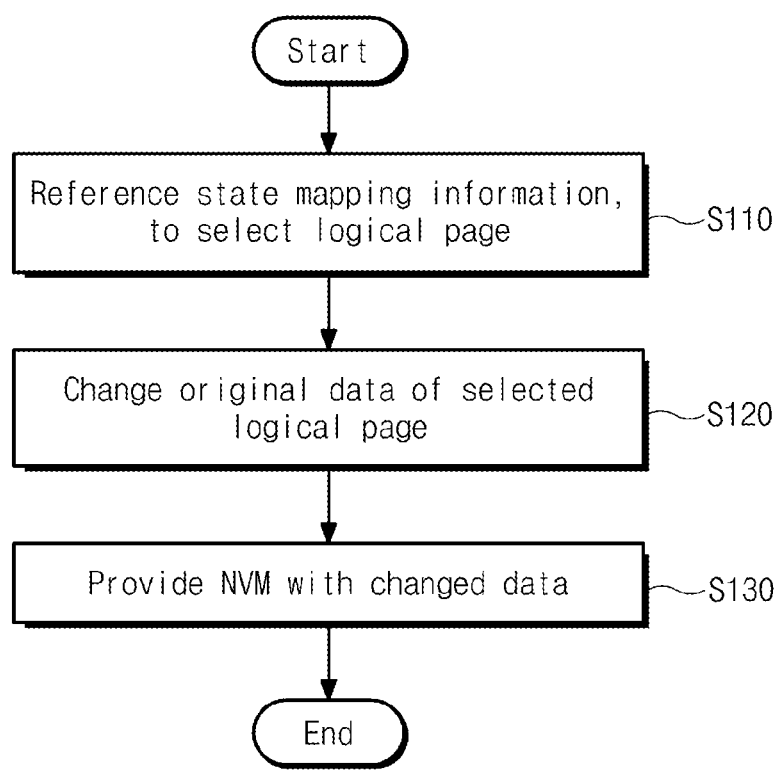
FIG. 13 is a flow chart generally summarizing in one example a state shaping operation executed by a memory controller in accordance with certain embodiments of the inventive concept.

FIG. 13 is a flow chart generally summarizing a state shaping operation that may be performed by a memory controller operating in accordance with embodiments of the inventive concept.

First, the state shaping encoder 1271 may be used to select a logical page defined according to the operation of a nonvolatile memory device including MLC (S110). This selection of a particular logical page may be made with reference to provided state shape mapping information. For example, assuming the use of 4-bit MLC in the nonvolatile memory device, at least one logical page may be selected from among first, second, third and fourth logical pages by the state shaping encoder 1271. In certain embodiments of the inventive concept, the state shape mapping information may be information identifying relative occurrence probabilities for each possible data state, including at least one designated high-order program state and at least one designated low-order program state. The state shape mapping information may include different version of said occurrence probabilities as adjusted by application of state shaping operations to reduce the relative number of "1's" or "0's" occurring in the program state data of interest.

Having selected a logical page, the state shaping encoder 1271 may be sued to change the incoming write data according to the state shape mapping information to thereby generate corresponding state-shaped encoded write data (S120). Consistent with certain embodiments of the inventive concept, the incoming write data is essentially randomized in its programmed state by the state shaping encoding operation.

Once the incoming write data has been changed to state-shaped encoded write data, the changed (or encoded) write data may be provided to, and programmed in the nonvolatile memory device (S130).

For a two-dimensional nonvolatile memory device the highest program state (or higher program states) may be of principle concern. In contrast, for a three-dimensional nonvolatile memory device, the erase state may be of principle concern.

FIGS. 14, 15, 16 and 17 are respective drawings that illustrate in various aspect a flash memory device including a three-dimension (or vertical) memory cell array. Such devices are well contemplated by certain embodiments of the inventive concept.

Figure 14:
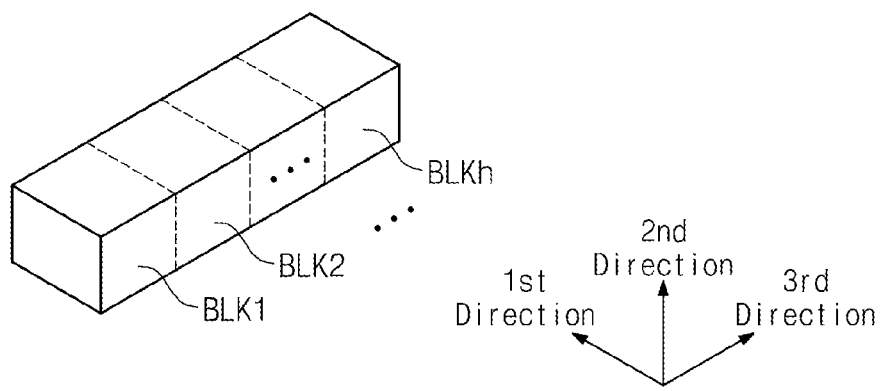
FIGS. 14, 15, 16 and 17 are respective drawings illustrating in certain examples a flash memory device having a three-dimensional memory cell array that may be incorporated into various embodiments of the inventive concept.

FIG. 14 is a block diagram further illustrating the memory cell array 1110 of FIG. 4. Referring to FIG. 14, the memory cell array 1110 includes a plurality of memory blocks BLK1~BLKh. Each memory block BLK has a three-dimensional structure (or a vertical structure). For instance, each memory block BLK includes structures extending in first through third directions.

Each memory block BLK includes a plurality of NAND strings NS extending along the second direction. A plurality of NAND strings NS is provided along the first and third directions. Each NAND string NS is connected to a bit line BL, at least one string select line SSL, at least one ground select line GSL, a plurality of word lines WL, at least one dummy word line DWL and a common source line CSL. Each memory block BLK is connected to a plurality of bit lines BL, a plurality of string select lines SSL, a plurality of ground select lines GSL, a plurality of word lines WL, a plurality of dummy word lines DWL and a plurality of common source lines CSL.

Figure 15:
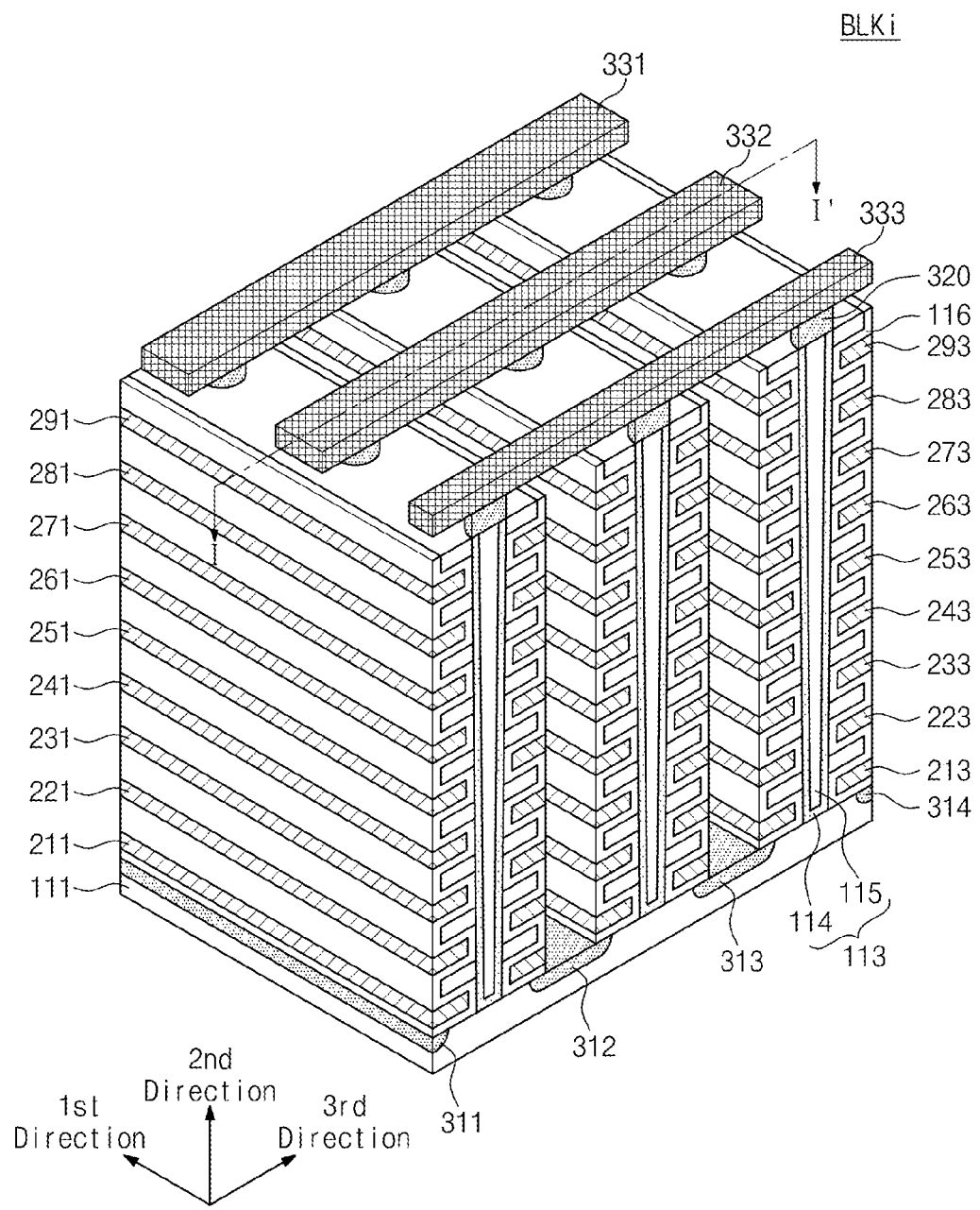
Figure 16:
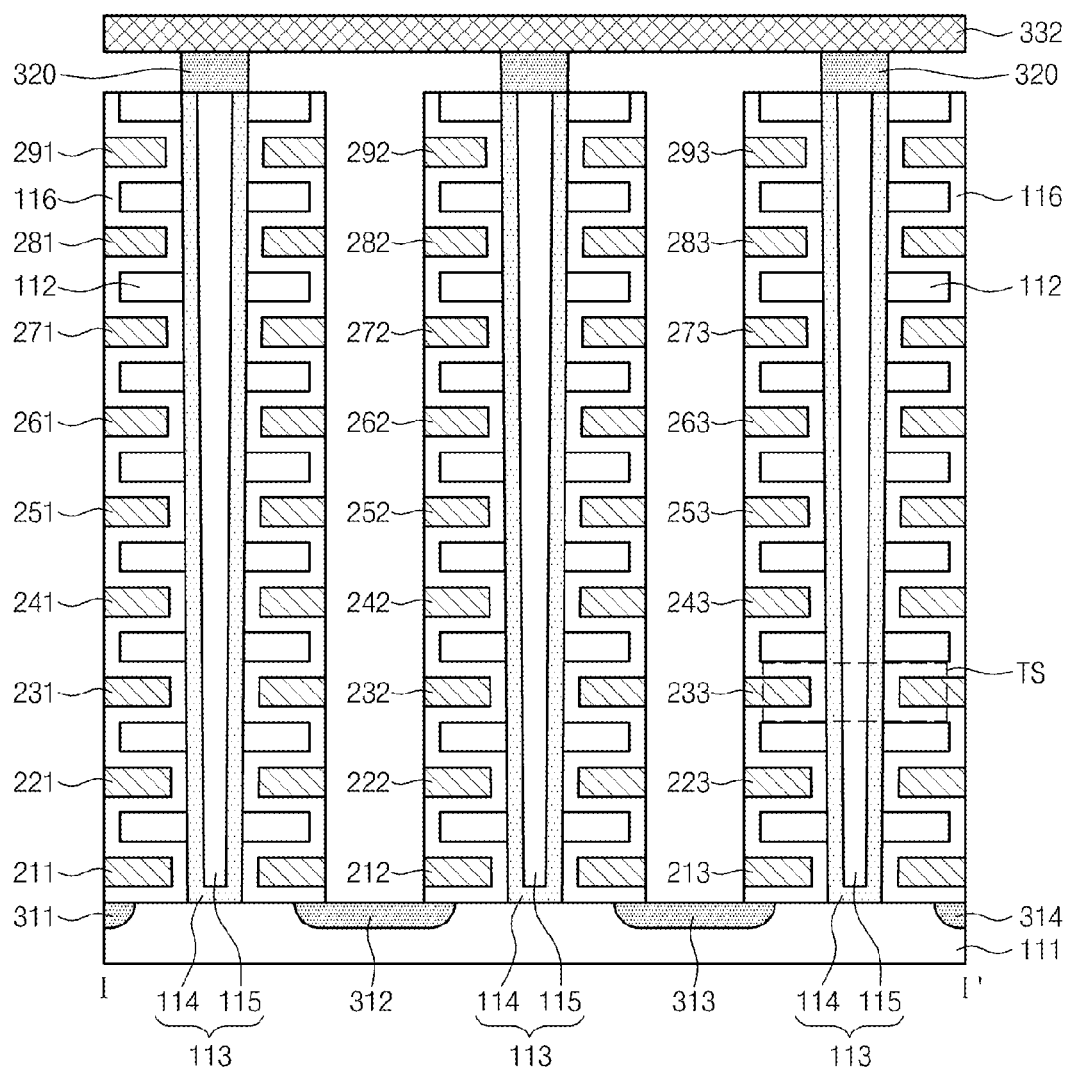

FIG. 15 is a perspective view further illustrating in one example the memory block BLKi of FIG. 14. FIG. 16 is a cross sectional view taken along the line I-I' of the memory block BLKi of FIG. 15. Referring to FIGS. 15 and 16, the memory block BLKi includes structures extending along the first through third directions.

A substrate 111 is provided. The substrate 111 includes silicon material doped with a first type impurity. For example, the substrate 111 may include silicon material doped with a p-type impurity, may be a p-type well (e.g., a pocket p well) and may further include an n-type well surrounding the p-type well. Hereinafter, it is assumed that the substrate 111 is p-type silicon. However, the substrate 111 is not limited to p-type silicon.

A plurality of doping regions 311~314 extending in the first direction is provided on the substrate 111. The doping regions 311~314 have a second type different than the substrate 111. For example, the doping regions 311~314 have an n-type. Hereinafter, it is assumed that the first through fourth doping regions 311~314 are an n-types. However, the first through fourth doping regions 311~314 are not limited to an n-type.

On the substrate 111 between the first and second doping regions 311 and 312, a plurality of insulating materials 112 extending in the first direction is sequentially provided along the second direction. The insulating materials 112 are spaced a predetermined distance apart from one another along the second direction. The insulating material 112 includes, for example, silicon oxide.

On the substrate 111 between the first and second doping regions 311 and 312, a plurality of pillars 113 sequentially disposed along the first direction and penetrating the insulating materials 112 along the second direction is provided. Each of the pillars 113 penetrates the insulating material 112 to be connected to the substrate 111.

Each pillar 113 is constituted by a plurality of materials. For example, a surface layer 114 of each pillar 113 includes silicon material doped with the first type. The surface layer 114 of each pillar 113 includes silicon material doped with the same type as the substrate 111. Hereinafter, it is assumed that the surface layer 114 of each pillar 113 includes p-type silicon. However, the surface layer 114 of each pillar 113 is not limited to the p-type silicon.

An internal layer 115 of each pillar 113 is constituted by insulating material. The internal layer 115 of each pillar 113 is filled with insulating material such as silicon oxide.

On a region between the first and second doping regions 311 and 312, an insulating layer 116 is provided along an exposed surface of the insulating materials 112, the pillars 116 and the substrate 111. A thickness of the insulating layer 116 is smaller than half of a distance between the insulating materials 112. A region in which material except the insulating material 112 and the insulating layer 116 can be disposed is provided between the insulating layer 116 provided to a bottom surface of a first insulating material among the insulating materials 112 and the insulating layer 116 provided to a top surface of a second insulating material disposed below the first insulating material.

On a region between the first and second doping regions 311 and 312, conductive materials 211~291 are provided on exposed surfaces of the insulating layers 116. For example, a conductive material 211 extending in the first direction is provided between the insulating material 112 adjacent to the substrate 111 and the substrate 111. The conductive material 211 extending in the first direction is provided between the insulating layer 116 on a bottom surface of the insulating material 112 adjacent to the substrate 111 and the insulating layer 116 on a top surface of the substrate 111.

A conductive material extending in the first direction is provided between the insulating layer 116 on a top surface of a specific insulating material among the insulating materials 112 and the insulating layer 116 on a bottom surface of an insulating material disposed over the specific insulating material. The conductive materials 221~281 extending in the first direction are provided between the insulating materials 112. The conductive material 291 extending in the first direction is provided over the insulating materials 112. The conductive materials 211~291 may be metallic material. The conductive materials 211~291 may be conductive materials such as polysilicon.

The same structure as the structure on the region between the first and second doping regions 311 and 312 is provided on a region between the second and third doping regions 312 and 313. There are provided on the region between the second and third doping regions 312 and 313 that a plurality of insulating materials 112 extending in the first direction, a plurality of pillars 113 sequentially disposed along the first direction and penetrating the insulating materials 112 along the third direction, insulating layers 116 provided on exposed surfaces of the insulating materials 112 and the pillars 113, and a plurality of conductive materials 212~292 extending in the first direction.

The same structure as the structure on the region between the first and second doping regions 311 and 312 is provided on a region between the third and fourth doping regions 313 and 314. There are provided on the region between the third and fourth doping regions 313 and 314 that a plurality of insulating materials 112 extending in the first direction, a plurality of pillars 113 sequentially disposed along the first direction and penetrating the insulating materials 112 along the third direction, insulating layers 116 provided on exposed surfaces of the insulating materials 112 and the pillars 113, and a plurality of conductive materials 213~293 extending in the first direction.

Drains 320 are provided on the pillars 113 respectively. The drains 320 are silicon materials doped with the second type. For example, the drains 320 may be silicon materials doped with an n-type. Hereinafter, it is assumed that the drains 320 include n-type silicon. However, the drains 320 are not limited to n-type silicon. A width of the drain 320 may be greater than a width of the corresponding pillar 113. Each drain 320 may be provided on a top surface of the corresponding pillar in the form of a pad.

Conductive materials 331~333 extending in the third direction are provided on the drains 320. The conductive materials 331~333 are sequentially disposed along the first direction. Each of the conductive materials 331~333 is connected to the corresponding drains 320. For example, the drains 320 can be connected to the conductive material 330 through contact plugs. The conductive materials 331~333 extending in the third direction may be metallic material. The conductive materials 331~333 extending in the third direction may be conductive material such as polysilicon.

Figure 17:
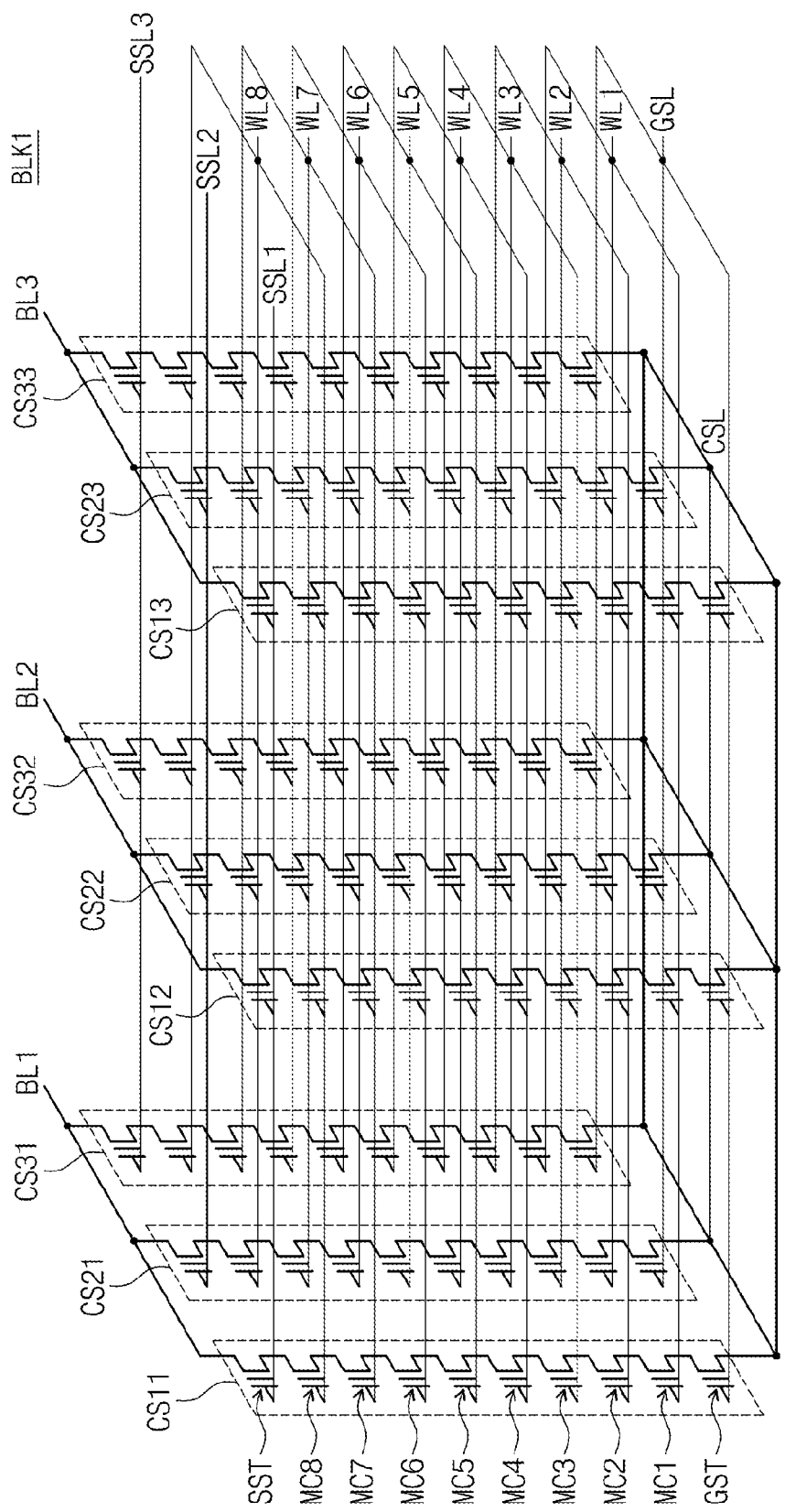

FIG. 17 is an equivalent circuit diagram for a portion of the memory block illustrated in FIG. 15. Referring to FIG. 17, cell strings CS11 to CS33 may be connected between bit lines BL1 to BL3 and a common source line CSL. Each cell string (e.g., CS11) may include a string selection transistor SST, a plurality of memory cells MC1 to MC8, and a ground selection transistor GST.

The string selection transistors SST may be connected with a string selection line. The string selection transistors SST may be divided into first to third string selection lines SSL1 to SSL3. The ground selection transistors GST may be connected with a ground selection line GSL. The ground selection line GSL of each cell string may be connected. In each NAND string, the string selection transistor SST may be connected with a bit line and the ground selection transistor GST may be connected with a common source line CSL.

The memory cells MC1 to MC8 may be connected with corresponding word lines WL1 to WL8. A set of memory cells which are connected with a word line and programmed at the same time may be referred to as a page. The memory block BLK1 may be formed of a plurality of pages. Also, a word line may be connected with a plurality of pages. Referring to FIG. 17, a word line (e.g., WL4) placed at the same height from the common source line CSL may be connected in common with three pages.

Each memory cell may store a data bit or two or more data bits. A memory cell storing a data bit may be referred to as a single level cell (SLC) or a single bit cell. A memory cell storing two or more data bits may be referred to as a multi-level cell (MLC) or a multi-bit cell. In case of a 2-bit MLC, two pages of data may be stored at a physical page. Thus, six pages of data may be stored at memory cells connected with the fourth word line WL4.

Figure 18:
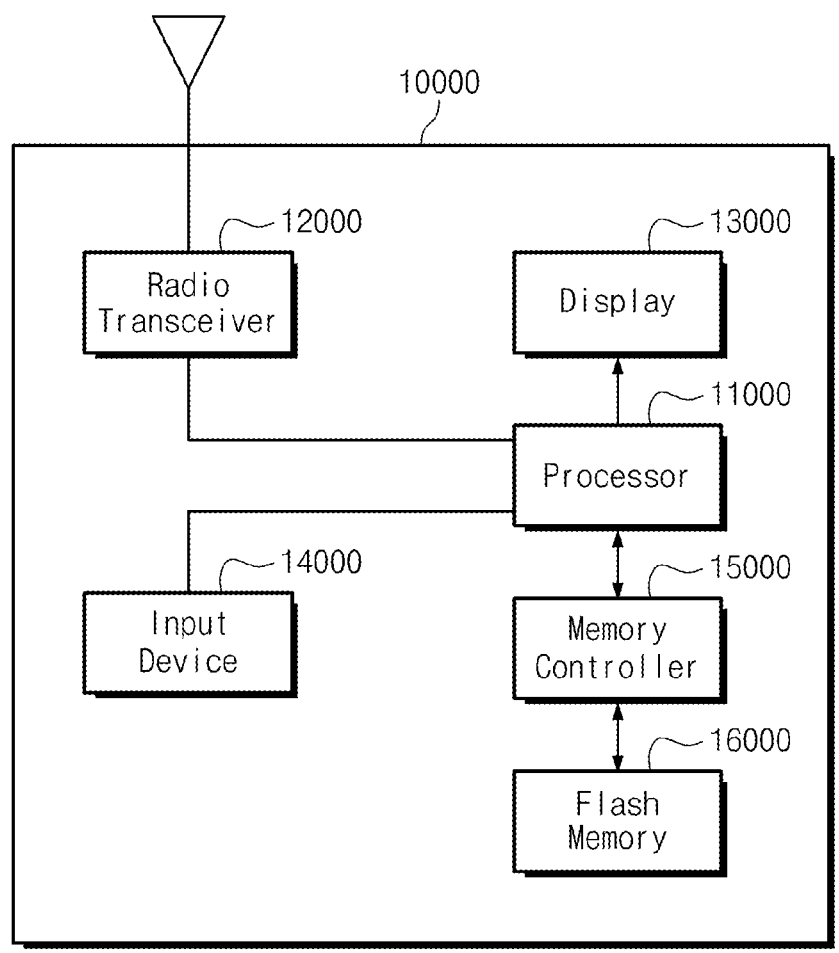
FIG. 18 is a block diagram illustrating an electronic device including a memory controller and a nonvolatile memory device in accordance with an embodiment of the inventive concept.

FIG. 18 is a block diagram illustrating an electronic device 10000 including a memory controller 15000 and a nonvolatile memory device 16000 in accordance with an embodiment of the inventive concept.

Referring to FIG. 18, the electronic device 10000 such as a cellular phone, a smart phone, or a tablet PC may include the nonvolatile memory device 16000 that can be embodied by a flash memory device and the memory controller 15000 that can control an operation of the nonvolatile memory device 16000.

The nonvolatile memory device 1600 may mean the nonvolatile memory device 1100 illustrated in FIG. 1. The nonvolatile memory device 16000 can store data in which a state shaping is performed.

The memory controller 15000 is controlled by a processor controlling an overall operation of the electronic device 10000.

Data stored in the nonvolatile memory device 16000 can be displayed through a display 13000 under the control of the memory controller 15000 that operates under the control of the processor 11000.

A radio transceiver 12000 can transmit or receive a radio signal through an antenna ANT. The radio transceiver 12000 can convert a radio signal received through the antenna ANT into a signal which the processor 11000 can process. Thus, the processor 11000 can process a signal output from the radio transceiver 12000 and the processor 11000 can store the processed signal in the nonvolatile memory device 16000 through the memory controller 15000 or can display the processed signal through the display 13000.

The radio transceiver 12000 can convert a signal output from the processor 11000 into a radio signal and can output the converted radio signal to the outside through the antenna ANT.

An input device 14000 can input a control signal for controlling an operation of the processor 11000 or data to be processed by the processor 11000. The input device 14000 can be embodied by a keypad, a keyboard or a pointing device such as a touch pad and a computer mouse.

The processor 11000 can control the display 13000 so that data output from the nonvolatile memory device 16000, a radio signal output from the radio transceiver 12000, or data output from the input device 14000 can be displayed through the display 13000.

Figure 19:
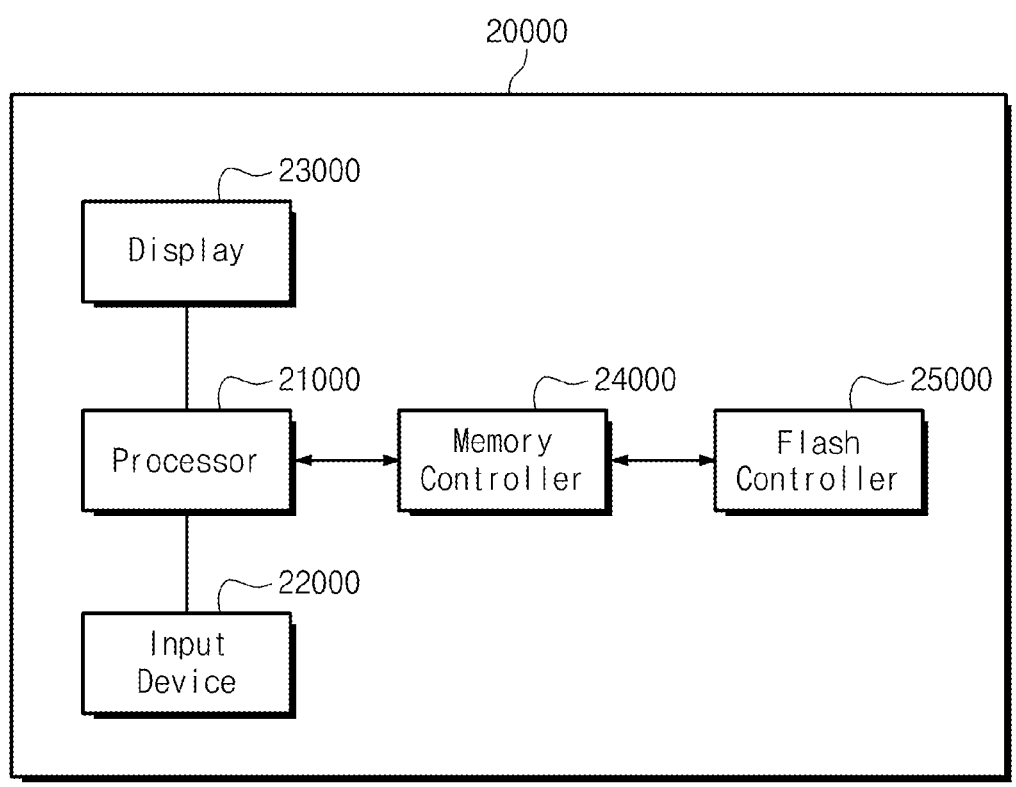
FIG. 19 is a block diagram illustrating an electronic device including a memory controller and a nonvolatile memory device in accordance with another embodiment of the inventive concept.

FIG. 19 is a block diagram illustrating an electronic device 20000 including a memory controller 24000 and a nonvolatile memory device 25000 in accordance with another embodiment of the inventive concept.

Referring to FIG. 19, the electronic device 20000 that can be embodied by a data processing device such as a personal computer (PC), a tablet computer, a net-book, an e-reader, a personal digital assistant (PDA), a portable multimedia player (PMP), a MP3 player, or a MP4 player may include the nonvolatile memory device 25000 such as a flash memory device and the memory controller 24000 that can control an operation of the nonvolatile memory device 25000.

The nonvolatile memory device 25000 may mean the nonvolatile memory device illustrated in FIGS. 1 through 18. The nonvolatile memory device 25000 can store state shaping data.

The electronic device 20000 may include a processor 2100 to control an overall operation of the electronic device 20000. The memory controller 24000 is controlled by the processor 24000.

The processor 21000 can display data stored in the nonvolatile memory device 25000 through a display according to an input signal generated by the input device 22000. The input device 22000 can be embodied by a keypad, a keyboard or a pointing device such as a touch pad and a computer mouse.

Figure 20:
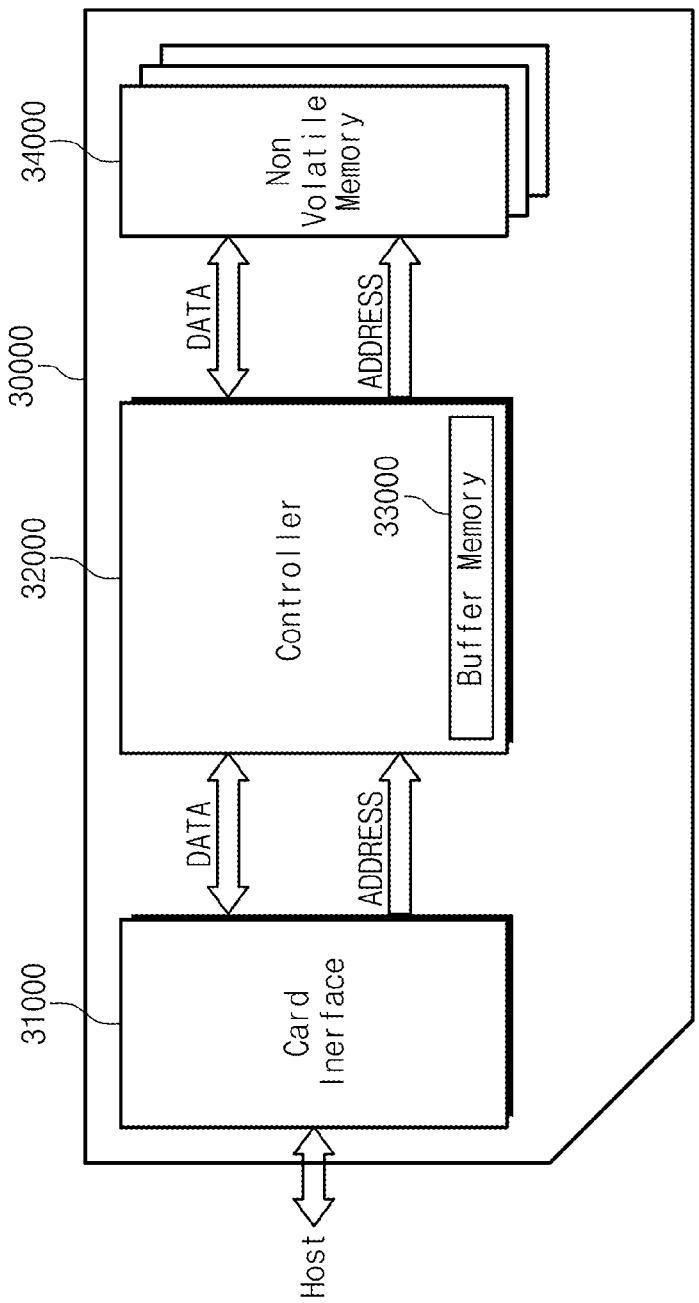
FIG. 20 is a block diagram illustrating an electronic device including a nonvolatile memory device in accordance with still another embodiment of the inventive concept.

FIG. 20 is a block diagram illustrating an electronic device 30000 including a nonvolatile memory device 3400 in accordance with still another embodiment of the inventive concept.

Referring to FIG. 20, the electronic device 30000 includes a card interface 31000, a memory controller 32000 and a nonvolatile memory device 3400, for example, a flash memory device.

The electronic device 30000 can exchange data with a host through the card interface 31000. Depending on embodiments, the card interface 31000 may be a secure digital (SD) card interface or a multi-media card (MMC) but the inventive concept is not limited to the secure digital (SD) card interface or a multi-media card (MMC). The card interface 31000 can interface data exchange between the host and the memory controller 32000 according to a communication protocol of the host that can communicate with the electronic device 30000.

The memory controller 32000 can control an overall operation of the electronic device 30000 and can control a data exchange between the card interface 31000 and the nonvolatile memory device 34000. A buffer memory 33000 of the memory controller 32000 can buffer data being exchanged between the card interface 31000 and the nonvolatile memory device 34000.

The memory controller 32000 is connected to the card interface 31000 and the nonvolatile memory device 34000 through a data bus DATA and an address bus ADDRESS. The memory controller 32000 receives an address of data to be read or written from the card interface 31000 through the address buss ADDRESS and transmits the address of data to the nonvolatile memory device 34000.

The memory controller 32000 receives or transmits data to be read or written through the data bus DATA connected to the card interface 31000 and the nonvolatile memory device 34000.

The nonvolatile memory device 34000 may mean the nonvolatile memory device illustrated in FIG. 1. The nonvolatile memory device 34000 can store random data.

When the electronic device 30000 of FIG. 20 is connected to the host such as a PC, a tablet PC, a digital camera, a digital audio player, a mobile phone, a console video game hardware, or a digital-set-top box, the host can exchange data stored in the nonvolatile memory device 34000 through the card interface 31000 and the memory controller 32000.

Figure 21:
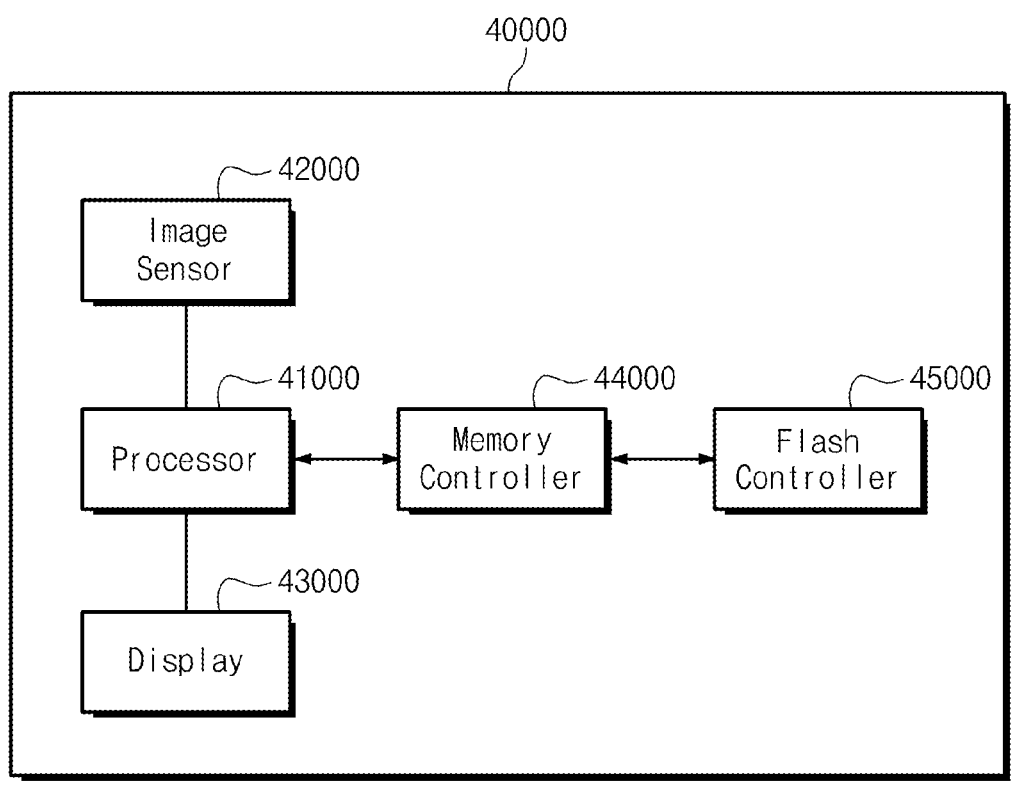
FIG. 21 is a block diagram illustrating an electronic device including a memory controller and a nonvolatile memory device in accordance with yet another embodiment of the inventive concept.

FIG. 21 is a block diagram illustrating an electronic device including a memory controller and a nonvolatile memory device in accordance with yet another embodiment of the inventive concept.

Referring to FIG. 21, an electronic device 40000 includes a nonvolatile memory device 45000 such as a flash memory device, a memory controller 44000 for controlling a data processing operation of the nonvolatile memory device 45000 and an image sensor 42000 that can control an overall operation of the electronic device 40000.

The image sensor 42000 of the electronic device 40000 converts an optical signal into a digital signal and the converted digital signal is stored in the nonvolatile memory device 45000 or is displayed through a display 43000 under the control of the image sensor 42000. The digital signal stored in the nonvolatile memory device 45000 is displayed through the display 43000 under the control of the image sensor 42000.

Figure 22:
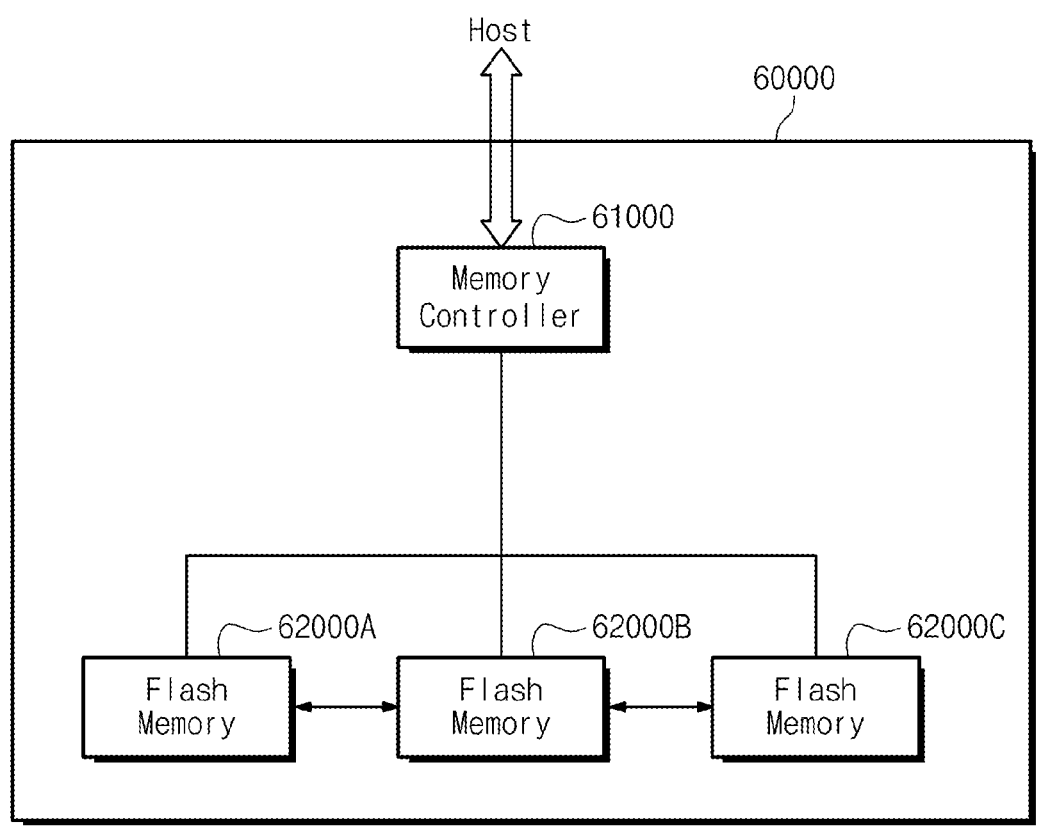
FIG. 22 is a block diagram illustrating an electronic device including a memory controller and a nonvolatile memory device in accordance with still yet another embodiment of the inventive concept.

FIG. 22 is a block diagram illustrating an electronic device including a memory controller and a nonvolatile memory device in accordance with still yet another embodiment of the inventive concept.

Referring to FIG. 22, an electronic device 60000 can be embodied by a data storage device such as a solid state drive (SSD).

The electronic device 60000 may include multiple nonvolatile memory devices 62000A, 62000B and 62000C, and a memory controller 61000 that can control a data processing operation of each of the multiple nonvolatile memory devices 62000A, 62000B and 62000C.

The electronic device 60000 can be embodied by a memory system or a memory module.

The nonvolatile memory device 62000 may mean the nonvolatile memory device illustrated in FIGS. 1 and 12. The nonvolatile memory device 62000 can store random data.

Depending on embodiments, the memory controller 61000 can be embodied inside or outside the electronic device 60000.

Figure 23:
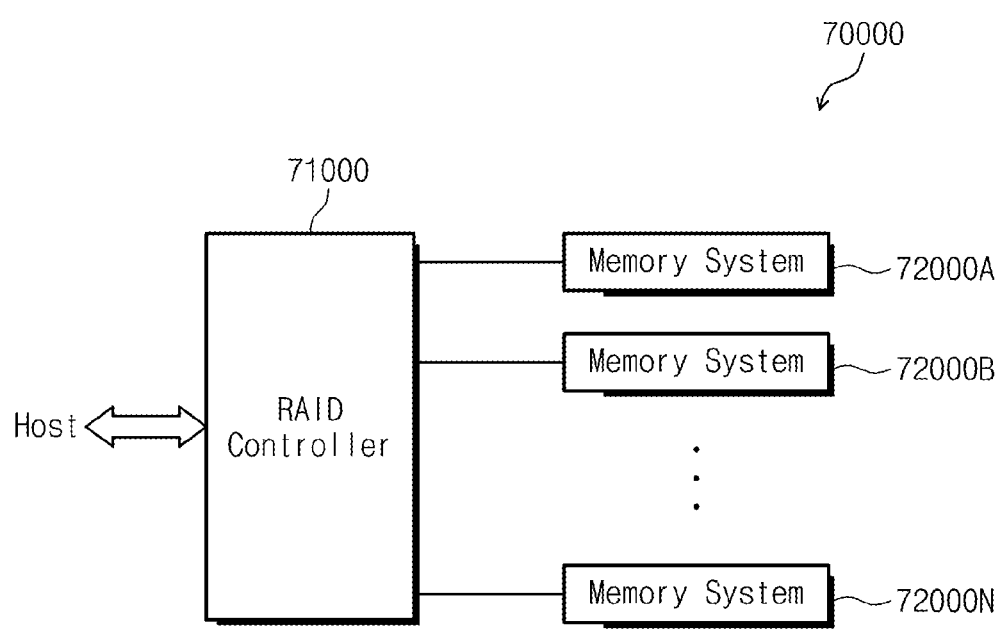
FIG. 23 is a block diagram further illustrating a data processing system that may be incorporated within the electronic device of FIG. 22.

FIG. 23 is a block diagram illustrating a data processing device including an electronic device illustrated in FIG. 22.

Referring to FIGS. 22 and 23, a data processing device 70000 that can be embodied by a redundant array of independent disks (RAID) system may include a RAID controller 71000 and multiple memory systems 72000A, 72000B, . . . , 72000N (N is a natural number).

Each of the multiple memory systems 72000A, 72000B, . . . , 72000N may be the electronic device 1000 illustrated in FIG. 1. The multiple memory systems 72000A, 72000B, . . . , 72000N can constitute a RAID array. The data processing device 70000 can be embodied by a personal computer (PC) or a solid state drive (SSD).

During a program operation, the RAID controller 71000 can output program data output from a host to any one memory system among the multiple memory systems 72000A, 72000B, . . . , 72000N according to any one RAID level selected on the basis of RAID level information output from the host among multiple RAID levels.

During a read operation, the RAID controller 71000 can transmit data read from any one memory system among the multiple memory systems 72000A, 72000B, . . . , 72000N according to any one RAID level selected on the basis of RAID level information output from the host among multiple RAID levels.

A memory controller performs a state shaping operation on data provided from a host. The state shaping operation changes a data pattern to prevent performance degradation of a nonvolatile memory cell, thereby improving reliability of a nonvolatile memory device.

Although a few embodiments of the present general inventive concept have been shown and described, it will be appreciated by those skilled in the art that changes may be made in these embodiments without departing from the scope of the appended claims and their equivalents. Therefore, the above-disclosed subject matter is to be considered illustrative, and not restrictive.

What is claimed is:

1. A memory controller configured to control the operation of a nonvolatile memory device including memory cells, each of memory cells programmed to have one of first to fifteenth program states and an erase state, the fifteenth program state being a highest-order program state having an upper limit of threshold voltage distribution higher than that of the erase state and other program states, the memory controller comprising:

a state shaping engine configured to receive write data including first to fourth logical pages from a host, select at least one of the first to fourth logical pages based on state shaping mapping information, and perform a state shaping operation on the selected at least one logical page to generate state-shape encoded data to be programmed in the nonvolatile memory device, wherein the fourth, fifth, eighth, ninth, and twelfth to fifteenth program states correspond to a first data value in the first logical page, the second to sixth, thirteenth, and fourteenth program states correspond to the first data value in the second logical page, the first to fourth and ninth to thirteenth program states correspond to the first data value in the third logical page, and the third to tenth program states correspond to the first data value in the fourth logical page, and wherein the state shaping operation is performed by decreasing a number of a data value corresponding to the fifteenth program state in at least one of the first to fourth logical pages.

2. The memory controller of claim 1, wherein
the erase state, the first to third, sixth, seventh, tenth, and eleventh program states correspond to a second data value being difference from the first data value in the first logical page, the erase state, the first, seventh to eleventh, and fifteenth program states correspond to the second data value in the second logical page, the erase state, the fifth to eighth, fourteenth, and fifteenth program states correspond to the second data value in the third logical page, and the erase state, the first, second, and eleventh to fifteenth program states correspond to the second data value in the third logical page.

3. The memory controller of claim 2, wherein the state shaping mapping information includes information on logical page to be selected such that an occurrence probability of the fifteenth program state is decreased and an occurrence probability of some of the first to fourth program states is increased by performing the state shaping operation.

4. The memory controller of claim 3, further comprising a RAM configured to store the state shaping mapping information, and
wherein the state shaping mapping information is stored in the RAM during a manufacture of the memory controller.

5. The memory controller of claim 4, wherein the state shaping mapping information is updated during periodic software updates for the memory controller.

6. The memory controller of claim 2, wherein
if the first and fourth logical pages are selected as logical pages to be subjected to the state shaping operation, the state shaping engine is configured to decrease a number of the first data value in the first logical page and a number of the second data value in the fourth logical page, and the state shaping engine is configured to increase a number of the second data value in the first logical page and a number of the first data value in the fourth logical page.

7. The memory controller of claim 6, wherein
occurrence probabilities of the first to fourth program states are increased in the state-shape encoded data and occurrence probabilities of the twelfth to fifteenth program states are decreased in the state-shape encoded data.

8. The memory controller of claim 2, wherein
if the first, third, and fourth logical pages are selected as logical pages to be subjected to the state shaping operation, the state shaping engine is configured to decrease a number of the first data value in the first logical page, a number of the second data value in the third logical page, and a number of the second data value in the fourth logical page, and the state shaping engine is configured to increase a number of the second data value in the first logical page, a number of the first data value in the third logical page, and a number of the first data value in the fourth logical page.

9. The memory controller of claim 2, wherein
if the first to fourth logical pages are selected as logical pages to be subjected to the state shaping operation, the state shaping engine is configured to decrease a number of the first data value in the first logical page, a number of the second data value in the second logical page, a number of the second data value in the third logical page, and a number of the second data value in the fourth logical page, and the state shaping engine is configured to increase a number of the second data value in the first logical page, a number of the first data value in the second logical page, a number of the first data value in the third logical page, and a number of the first data value in the fourth logical page.

10. The memory controller of claim 9, wherein occurrence probabilities of the second to fourth program states are increased in the state-shape encoded data, and occurrence probabilities of the eleventh to fifteenth program states are decreased in the state-shape encoded data.

11. The memory controller of claim 1, further comprising:
an error detection/correction (ECC) engine configured to encode the state-shape encoded data from the state shaping engine using a coded modulation to generate ECC-encoded data that is programmed to the nonvolatile memory device.

12. The memory controller of claim 11, wherein the ECC engine is configured to receive the ECC-encoded data from the nonvolatile memory device, and decode the ECC-encoded data using the coded modulation to generate the state-shape encoded data.

13. The memory controller of claim 12, wherein the state shaping engine is configured to decode the state-shape encoded data from the ECC engine to generate the write data.

* * * * *